| (12) | United States Patent | (10) Patent No.: | US 9,455,143 B2 |
|---|---|---|---|
| | Srinivasan et al. | (45) Date of Patent: | Sep. 27, 2016 |

(54) ATOMIC LAYER EPITAXY FOR SEMICONDUCTOR GATE STACK LAYER FOR ADVANCED CHANNEL DEVICES

(71) Applicant: Applied Materials, Inc., Santa Clara, CA (US)

(72) Inventors: Swaminathan T. Srinivasan, Pleasanton, CA (US); Aaron Muir Hunter, Santa Cruz, CA (US); Matthias Bauer, Sunnyvale, CA (US); Amikam Sade, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/789,075

(22) Filed: Jul. 1, 2015

(65) Prior Publication Data

US 2016/0013046 A1     Jan. 14, 2016

Related U.S. Application Data

(60) Provisional application No. 62/022,042, filed on Jul. 8, 2014.

(51) Int. Cl.
| *H01L 21/02* | (2006.01) |
|---|---|
| *H01L 21/67* | (2006.01) |
| *H01L 21/268* | (2006.01) |
| *H01L 21/687* | (2006.01) |

(52) U.S. Cl.
CPC ......... *H01L 21/0262* (2013.01); *H01L 21/268* (2013.01); *H01L 21/67028* (2013.01); *H01L 21/67115* (2013.01); *H01L 21/68742* (2013.01)

(58) Field of Classification Search
CPC ....... H01L 21/02; H01L 20/20; H01L 21/67; H01L 21/285; H01L 21/265; H01L 21/223; H01L 21/225; H01L 21/471; H01L 21/475; H01L 21/2258; H01L 21/0257; H01L 21/0258; H01L 21/02521; H01L 21/02617; H01L 21/268; H01L 21/0262; H01L 21/67115
USPC ....... 438/492, 308, 378, 463, 487, 478, 535, 438/795
See application file for complete search history.

(56) References Cited

U.S. PATENT DOCUMENTS

| 4,234,358 | A | 11/1980 | Celler et al. |
|---|---|---|---|
| 5,114,876 | A | 5/1992 | Weiner |
| 8,882,916 | B2 * | 11/2014 | Kumagai .......... C23C 16/45536 118/719 |
| 2001/0030292 | A1 * | 10/2001 | Brotherton ........ H01L 29/66757 250/492.2 |
| 2004/0011289 | A1 | 1/2004 | Morishige et al. |
| 2006/0288937 | A1 | 12/2006 | Dando et al. |
| 2008/0085413 | A1 | 4/2008 | Shimoda et al. |
| 2008/0132045 | A1 | 6/2008 | Yoo |
| 2013/0243971 | A1 | 9/2013 | Thompson et al. |
| 2014/0057418 | A1 | 2/2014 | Ma et al. |
| 2014/0159120 | A1 | 6/2014 | Ahmed |

OTHER PUBLICATIONS

PCT/US2015/038752, International Search Report, mailed Sep. 30, 2015.

* cited by examiner

*Primary Examiner* — Chuong A Luu
(74) *Attorney, Agent, or Firm* — Patterson & Sheridan, LLP

(57) ABSTRACT

Embodiments of the present disclosure provide methods and apparatus for forming an epitaxial layer on a substrate. The substrate is exposed to pulsed laser radiation to clean, anneal, and/or activate the surface of the substrate. The substrate is then exposed to a deposition precursor in a self-limiting deposition process. The substrate may again be exposed to pulsed laser radiation, and then exposed to a second deposition precursor in a second self-limiting deposition process. The process may be repeated as desired to form an epitaxial layer of very high quality one atomic layer at a time.

22 Claims, 17 Drawing Sheets

FIG. 2A

DIRECT A SECOND PULSE OF LASER RADIATION TO THE TARGET ZONE — 210

OPTIONALLY, WHILE DIRECTING THE SECOND PULSE OF LASER RADIATION TO THE TARGET ZONE, PURGE THE PROCESSING CHAMBER WITH AN INERT GAS — 212

INTRODUCE A SECOND GAS MIXTURE CONTAINING A SECOND DEPOSITION PRECURSOR INTO THE PROCESSING CHAMBER — 214

FIG. 2B

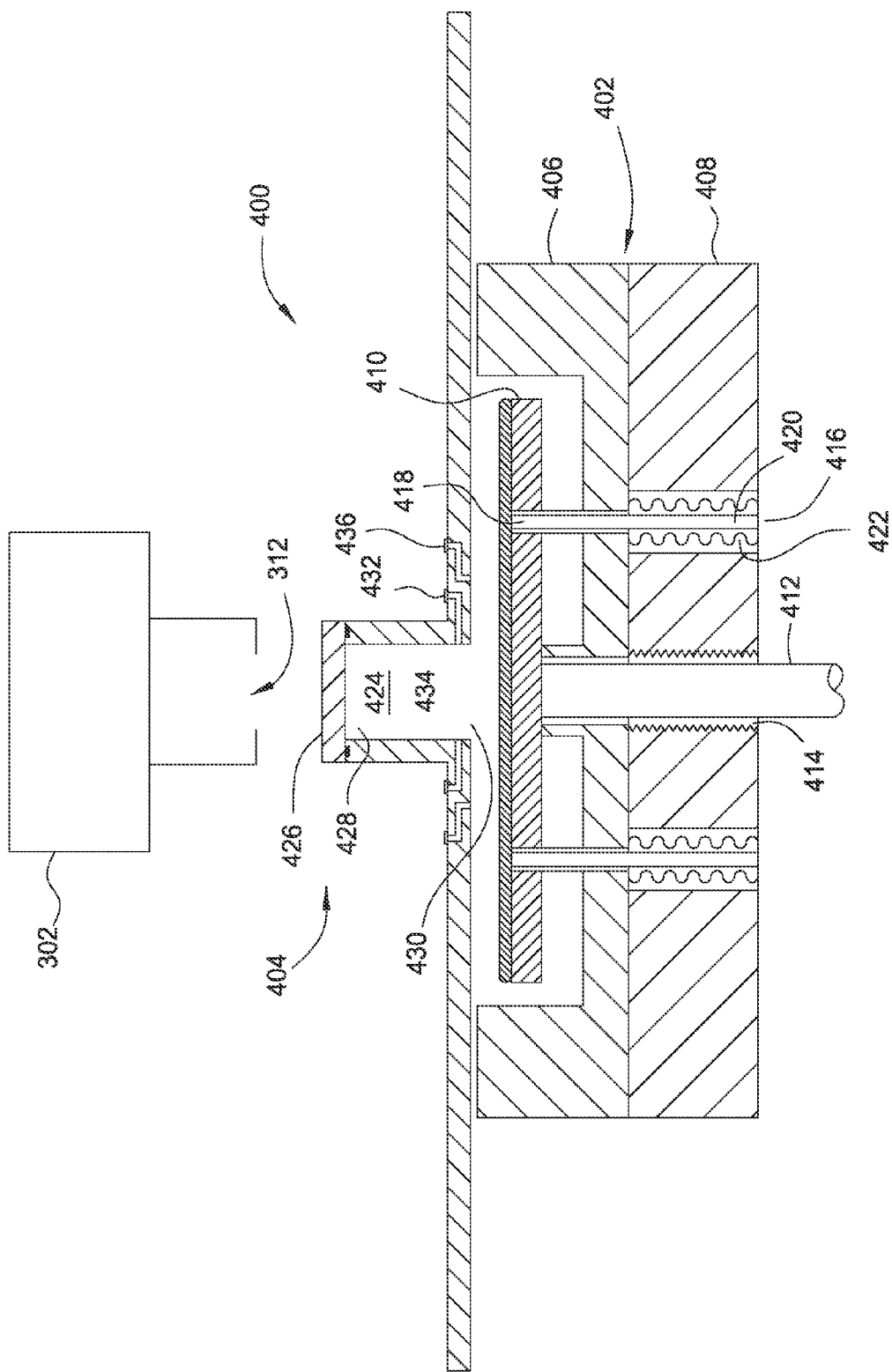

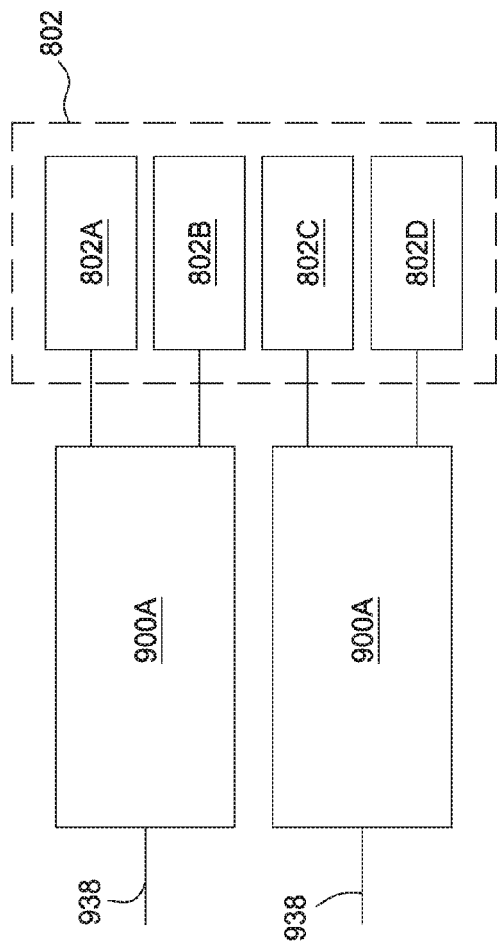
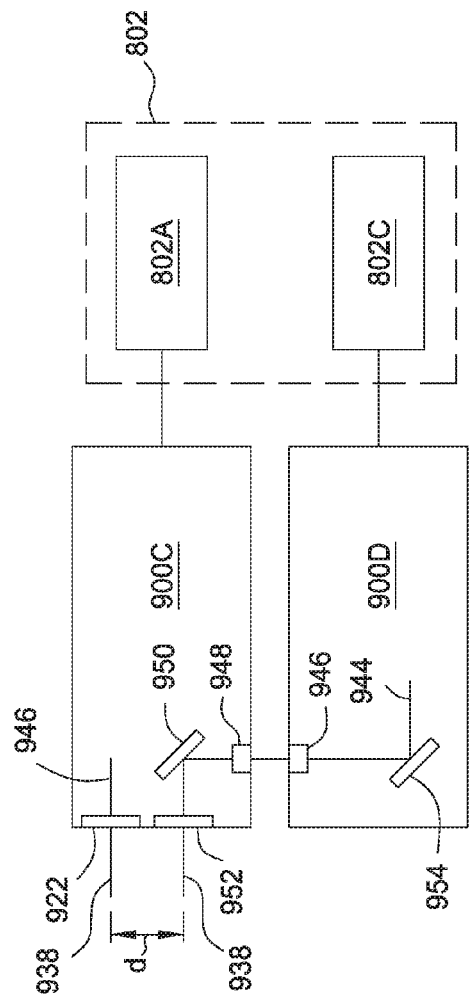

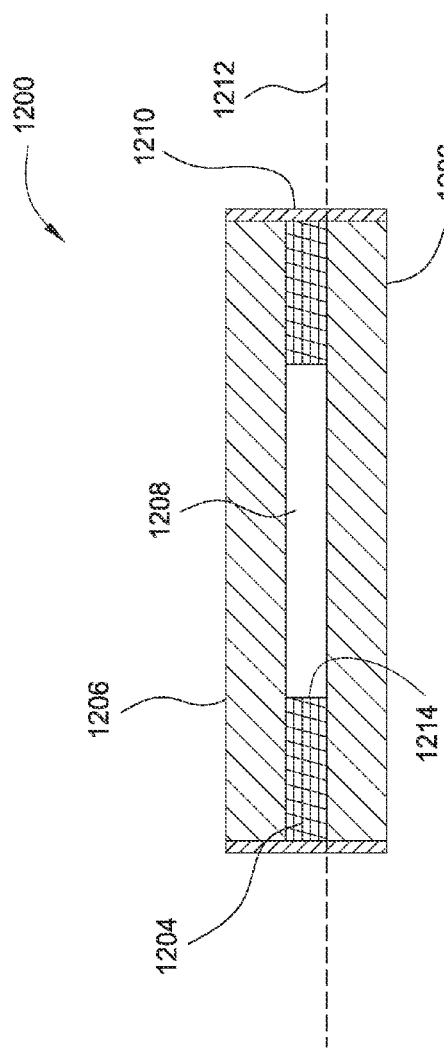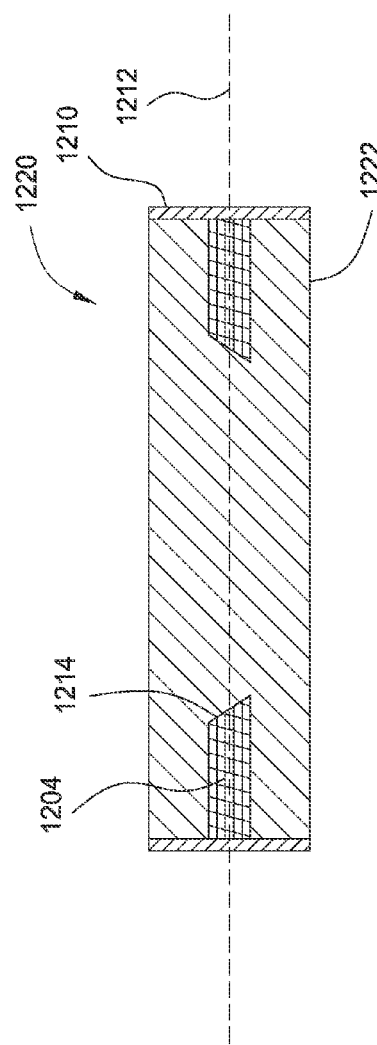

ATOMIC LAYER EPITAXY FOR SEMICONDUCTOR GATE STACK LAYER FOR ADVANCED CHANNEL DEVICES

CROSS-REFERENCE TO RELATED APPLICATIONS

This application claim benefit of U.S. Provisional Patent Application Ser. No. 62/022,042 filed Jul. 8, 2014, which is incorporated herein by reference.

FIELD

Embodiments of the present disclosure generally relate to methods and apparatus for semiconductor processing. More specifically, embodiments described herein relate to methods and apparatus for performing atomic layer epitaxy.

BACKGROUND

Epitaxy is a process that involves chemical addition of material to a surface in layers. Such processes are common in semiconductor processing, where they are used for building certain components of logic and memory devices. In a typical process for making a logic device, a silicon layer is grown epitaxially on a substrate to provide the most ordered crystal structure possible. This layer typically becomes the channel component of the transistor.

As the size of such devices continues to shrink, new processes for making smaller devices are needed. The declining geometries multiply engineering challenges confronting manufacturers of such devices. For example, as devices shrink toward critical dimensions of 5 nm or smaller, Therefore, there exists a need for a method and apparatus for building defect-free layers in semiconductor materials at very small dimensions.

SUMMARY

Embodiments described herein feature methods that include disposing a semiconductor substrate on a support in a vacuum chamber; exposing the semiconductor substrate to a first pulsed laser radiation having a pulse duration between about 10 nsec and about 10 μsec; exposing the irradiated semiconductor substrate to a first semiconductor precursor; forming a molecular layer of the first semiconductor precursor on the irradiated semiconductor substrate; exposing the irradiated semiconductor substrate to a second semiconductor precursor; reacting the second semiconductor precursor with the molecular layer of the first semiconductor precursor to form an epitaxial semiconductor layer; and exposing the epitaxial semiconductor layer to a second pulsed laser radiation having the same pulse duration as the first pulsed laser radiation.

Embodiments described herein also feature methods that include disposing the substrate on a substrate support in a processing chamber; identifying a first target zone of the substrate; positioning the first target zone of the substrate at a target location to receive a pulsed laser radiation field from a laser source by moving the substrate support; exposing the target location to the pulsed laser radiation field; providing a first deposition precursor to the processing chamber; depositing a monolayer from the first deposition precursor on the target location to form an epitaxial layer from the first deposition precursor in the target location; exposing the epitaxial layer to the pulsed laser radiation field; providing a second deposition precursor to the processing chamber; and depositing a monolayer from the second deposition precursor on the epitaxial layer in the target location.

Embodiments described herein also feature apparatus that include a processing chamber having a side wall and a bottom wall; an x-y actuator coupled to the bottom wall of the processing chamber; a substrate support disposed in the processing chamber, the substrate support having a processing surface and a support shaft disposed through the bottom wall and the x-y actuator; a source of pulsed laser radiation facing the processing surface; a window coupled to the processing chamber and separating the processing surface from the source of laser radiation; and a gas injector between the processing surface and the window.

BRIEF DESCRIPTION OF THE DRAWINGS

So that the manner in which the above recited features can be understood in detail, a more particular description may be had by reference to embodiments, some of which are illustrated in the appended drawings. It is to be noted, however, that the appended drawings illustrate only typical embodiments and are therefore not to be considered limiting, for other equally effective embodiments may be included.

FIGS. 2A and 2B set forth a flow diagram summarizing a method according to another embodiment.

FIG. 4A is a schematic cross-sectional view of an apparatus according to another embodiment.

FIGS. 9B and 9C are schematic views showing embodiments using multiple pulse controllers.

FIG. 12A is a side view of an aperture member of the laser source of FIG. 8 according to one embodiment.

FIG. 12B is a side view of an aperture member of the laser source of FIG. 8 according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
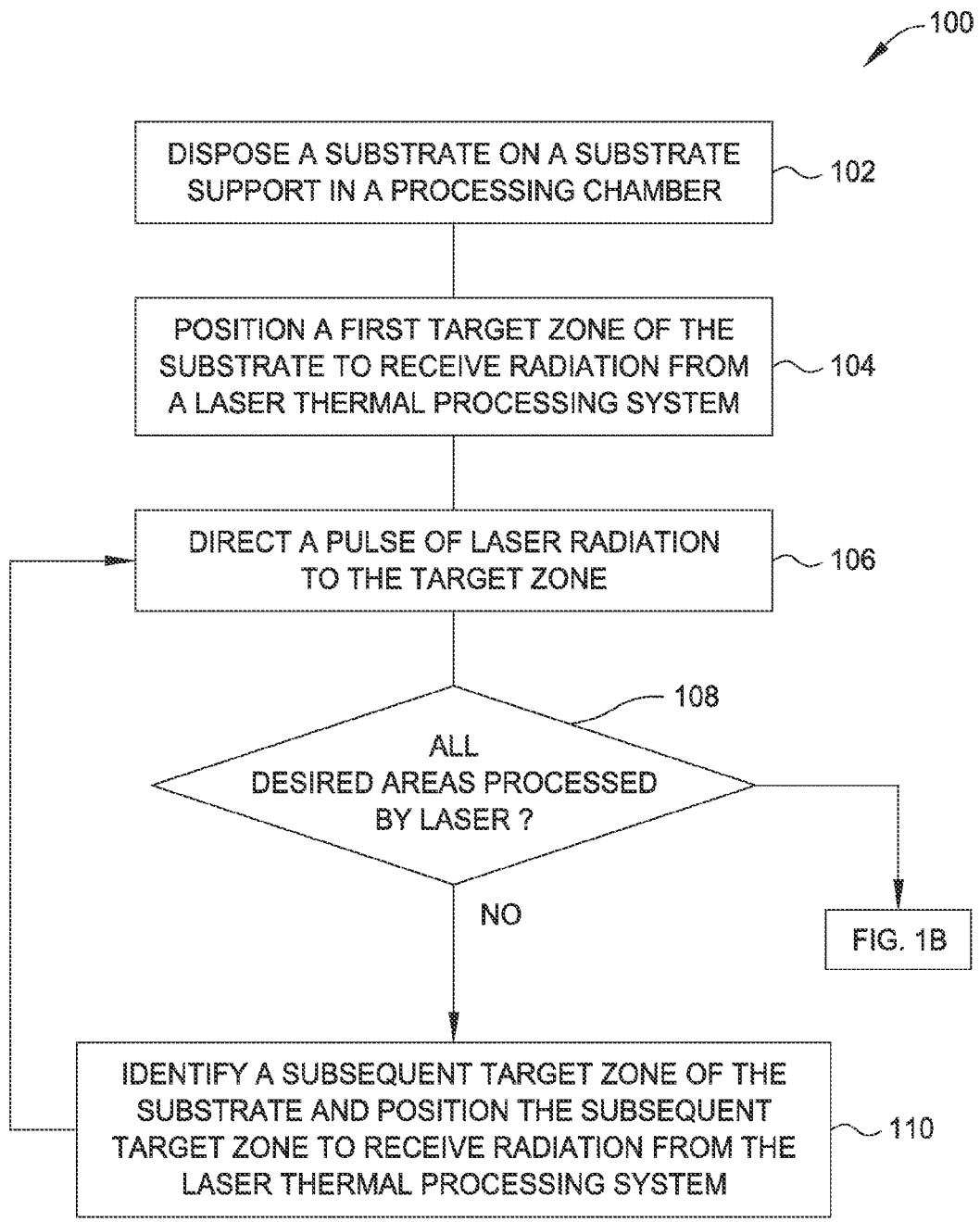
FIGS. 1A and 1B set forth a flow diagram summarizing a method according to one embodiment.
Figure 1B:
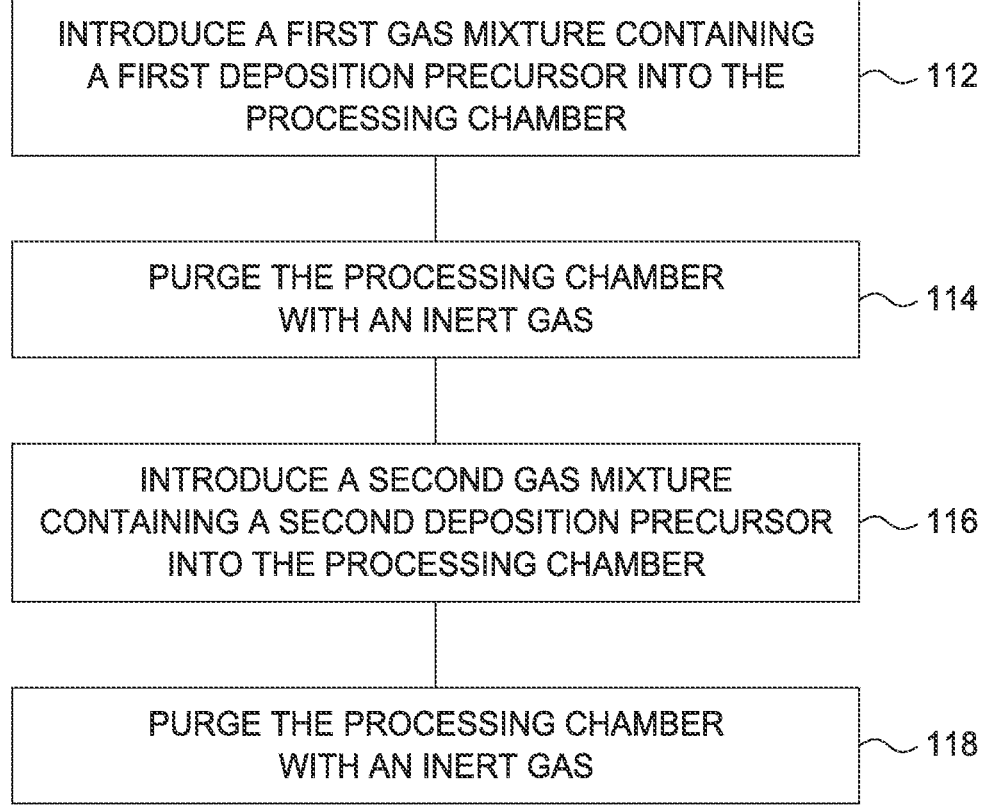

Embodiments of the present disclosure provide method and apparatus for atomic layer epitaxy of semiconductor materials. A method and apparatus for performing an epitaxy process on a substrate are provided. FIGS. 1A and 1B set forth a flow diagram summarizing a method 100 according to one embodiment. At 102 a substrate is disposed on a substrate support in a processing chamber. The processing chamber is disposed on a stage that is movable in an x-y plane and operable to position the chamber and the substrate accurately at a desired location.

At 104, a first target zone of the substrate is positioned to receive radiation from a laser thermal processing system. The laser thermal processing system is a pulsed laser system that may use one or more lasers, each having a power rating of about 1 MW to about 150 MW. The one or more lasers may be solid state lasers, such as Nd:YAG, titanium sapphire, Nd:glass, and the like, operating from the near UV, through the visible spectrum, to near IR wavelengths, such as 532 nm or 1064 nm. In one embodiment, the pulsed laser system uses four lasers with a pulse energy of 6 J, pulse duration of 10 ns, a pulse frequency of 5 Hz, a total peak power of about 600 MW, and an average power of 30 W.

The target zone is typically a portion of the substrate surface having an areal extent less than the areal extent of the substrate. The target zone of the substrate is positioned with respect to an optical system disposed between the one or more lasers and the processing chamber. The optical system may include one or more lenses, mirrors, diffusers, homogenizers, mode scramblers, or other optical elements that increase the spatial uniformity of the laser radiation. The optical system may additionally include one or more beam combiners for combining two or more laser beams into one effective beam. The optical system may shape and smooth the radiation field of the lasers into a uniform radiation field having non-uniformity less than about 10%.

At 106, a pulse of laser radiation is directed to the target zone of the substrate. The pulse of laser radiation may be made of radiation from one laser, two lasers, or more lasers. In some cases, three or four lasers may be used. The pulse of laser radiation may have a duration from about 10 nsec to about 50 μsec, for example about 50 nsec or about 75 nsec. The pulse may have a fluence between about 0.02 J/cm$^2$ and about 0.5 J/cm$^2$, such as between about 0.05 J/cm$^2$ and about 0.2 J/cm$^2$, for example about 0.1 J/cm$^2$. Total energy of one pulse may be from about 50 mJ to about 10 J, for example about 6 J. More than one pulse may be directed to the target zone of the substrate in some cases. Two or more pulses, for example five pulses or ten pulses may be directed to the target zone of the substrate. The radiation is usually directed to the substrate surface at an angle greater than about 80 degrees, for example greater than about 85 degrees, and may be substantially perpendicular to the substrate surface. Wishing not to be bound by theory, it is believed that the radiation pulses prepare the surface of the substrate for an epitaxial deposition by removing impurities and repairing or annealing the surface of the substrate. The short pulses of laser light may thermally process the surface of the substrate in the target zone to a depth of about 500 nm or less, and may organize the crystal structure of the substrate surface, removing defects and increasing the order of the crystal structure. Typically the laser treatment results in arranging the surface of the target zone of the substrate into near perfect crystal order with fewer than 5 defects in the target zone.

At 108, a second target zone of the substrate is identified, and the chamber is positioned by moving the x-y stage such that the second target zone is positioned to receive radiation from the laser thermal processing system. The operation of 106 is repeated on the second target zone. The second target zone may be adjacent to the first target zone, and may share a boundary with the first target zone. The second target zone may overlap with the first target zone. The process is repeated on successive target zones of the substrate until all areas of the substrate on which the epitaxy process is to be performed have been processed by the laser thermal processing system.

At 112, a first gas mixture is introduced into the processing chamber to perform a first deposition process. The first gas mixture contains a first deposition precursor that adheres to the substrate surface. The first gas mixture may contain a semiconductor deposition precursor, such as a group IV precursor, for example a silicon-containing precursor such as silane, disilane, or hexachlorodisilane, and/or a germanium-containing precursor such as germane or digermane, a group III precursor, such as trimethylaluminum, trimethylgallium, trimethylindium, and/or a borane (borane, diborane, triborane) or borazine, or a group V precursor such as phosphine, arsine, or ammonia. The first gas mixture may contain a group IV and a group III precursor or a group IV and a group V precursor. The first gas mixture may also include an inert component, such as argon, helium, hydrogen, or nitrogen as a diluent gas or a carrier gas.

The first gas mixture is introduced as a pulse of gas that provides enough deposition precursor to cover the substrate with a monolayer of the precursor, for example a pulse of 50% disilane by volume in hydrogen at 200 sccm for 1 second. The first precursor adheres to the substrate surface at an available adhesion site until all such sites are consumed, so the first deposition process is a self-limiting deposition process. The resulting monolayer of the first deposition precursor is thought to have extreme uniformity due to the surface preparation performed prior to exposing the substrate to the first gas mixture. The chamber is typically maintained at a temperature from about −10° C. to about 100° C., but may be maintained at a temperature up to about 500° C., for example from about 100° C. to about 500° C. in some cases. Pressure may be maintained from about 1 mTorr to about 50 Torr, for example from about 1 Torr to about 10 Torr in some cases.

At 114, the chamber may be purged with an inert gas, for example hydrogen, helium, argon, or nitrogen, to remove any remaining molecules of the first deposition precursor. In some cases, the inert gas may flow continuously from the introduction of the first gas mixture through the purge operation. Typically, the purge operation is maintained for 30 seconds or less, for example about 10 seconds or less. In one example, a flow of hydrogen gas may be maintained at 100 sccm for 10 seconds.

At 116, a second gas mixture is introduced into the processing chamber to perform a second deposition process. The second gas mixture may be the same as the first gas mixture or different from the first gas mixture in any aspect of flow rate or composition. The second gas mixture may contain a second deposition precursor that reacts with, or adheres to, the first deposition precursor arranged in a monolayer on the substrate. For example, the first gas mixture may include a silicon-containing precursor such as silane or disilane while the second gas mixture includes a germanium-containing precursor such as germane or digermane. In another aspect, the first gas mixture may contain a first silicon-containing precursor and the second gas mixture may contain a second silicon-containing precursor different from the first silicon-containing precursor. In another aspect, the first gas mixture may contain a first germanium-containing precursor and the second gas mixture may contain a second germanium-containing precursor different from the first germanium-containing precursor. In another aspect, the first gas mixture may contain a group III precursor and the second gas mixture may contain a group V precursor.

The substrate is exposed to the second gas mixture for a time sufficient to react the second deposition precursor with the first deposition precursor to form a compound. The first deposition precursor may have removable substituents that are displaced by reaction with the second deposition precursor to form the compound. The reaction of the second deposition precursor with the first deposition precursor continues while molecules of the first deposition precursor are exposed. When all such molecules have been consumed by reaction with the second deposition precursor, the reaction stops, so the second deposition process is a self-limiting deposition process. Temperature and pressure in the chamber are generally maintained in the same range for the second deposition as the first deposition, although temperature and pressure for the second deposition may be different from that for the first deposition.

In some cases, the substrate temperature may be maintained by heating the substrate during the deposition operations, or during the entire method 100. A heated substrate support, for example using resistive heat or a heating fluid disposed in a conduit formed through the substrate support, may be used for such processing. In such cases, the temperature in the chamber may be different from the temperature of the substrate. For example, the substrate temperature may be maintained from about 100° C. to about 500° C. by using a heated substrate support, while the temperature in the chamber is maintained near ambient temperature, or allowed to fluctuate with background heating.

At 118, a second purge similar to the first purge may be performed to remove any remaining molecules of the second deposition precursor from the processing chamber. The thermal process of 102-112 may be repeated to prepare the surface of the substrate for a second epitaxial exposure performed according to operations 114-118, if desired. The thermal process may complete the first epitaxy process by removing any removable groups from the second deposition precursor adhered to the substrate and by organizing the epitaxial layer formed from the first and second deposition precursors.

The combined epitaxy process and laser thermal process results in an epitaxial layer having extreme uniformity. It should be noted that the laser thermal process may be repeated after exposure of the substrate to the first gas mixture as well, for example the laser thermal process may be performed during any of the purge processes between deposition processes, if desired. In this way, a laser-assisted atomic layer epitaxy process may be performed.

In some embodiments, a selective laser-assisted atomic layer epitaxy process may be performed. A substrate may be prepared by depositing a deposition resistant layer on the substrate surface. Target areas of the substrate surface may then be defined, and the substrate may then be processed, in the target areas only, according to the method 100. In this way, a layer having extreme structural and compositional uniformity may be selectively formed on desired regions of a substrate.

Figure 2A:
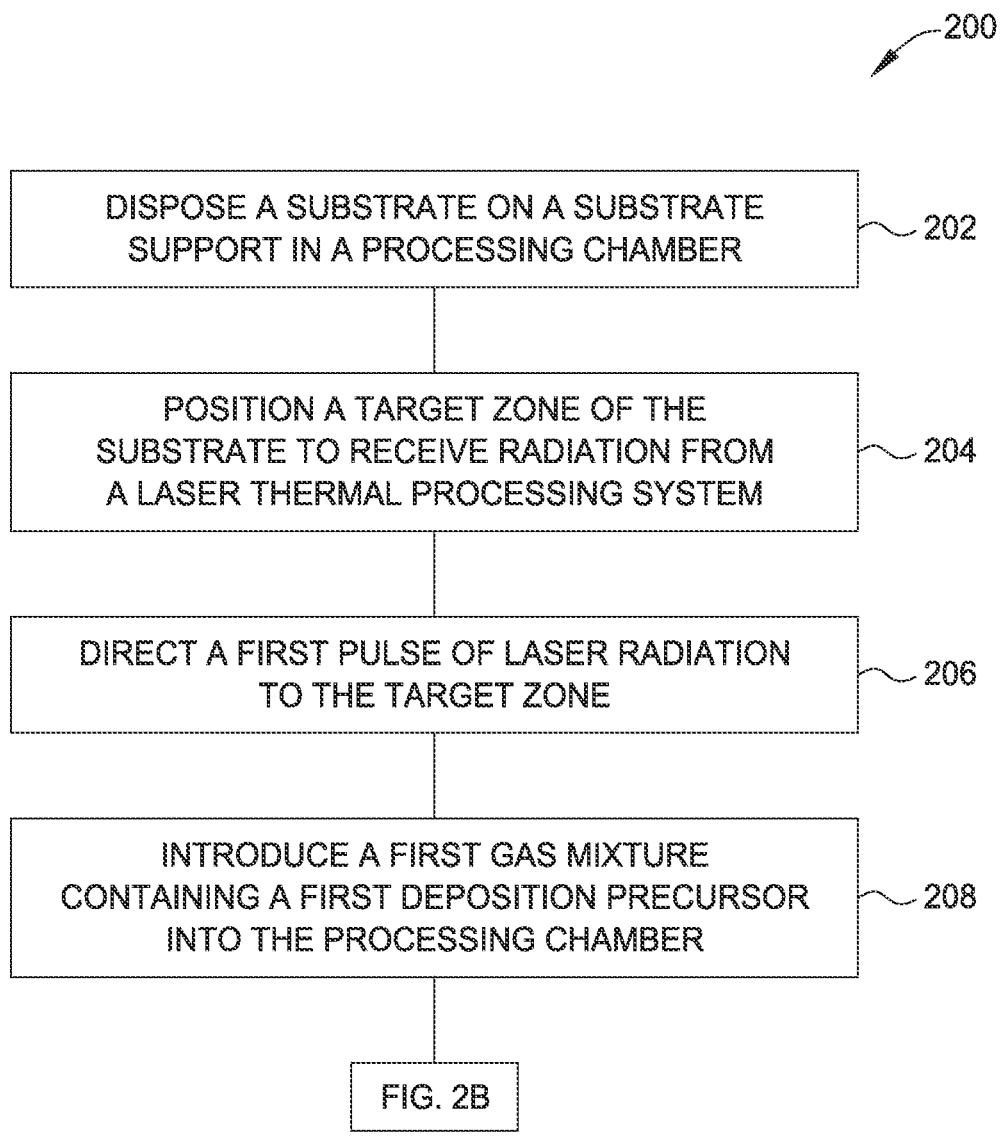

FIGS. 2A and 2B set forth a flow diagram summarizing a method 200 according to another embodiment. At 202 a substrate is disposed on a substrate support in a processing chamber disposed on an x-y stage, as described above. At 204, a first target zone of the substrate is positioned to receive radiation from a laser thermal processing system, such as the laser thermal processing system described above, or any of the laser thermal processing systems described herein. At 206, a first pulse of laser radiation is directed to the target zone of the substrate. The first pulse of laser radiation may be made of radiation from one laser, two lasers, or more lasers. In some cases, three or four lasers may be used. The first pulse of laser radiation may have a duration from about 10 nsec to about 50 microseconds, for example about 50 nsec or about 100 nsec. The first pulse may have a fluence between about 0.05 $J/cm^2$ and about 0.2 $J/cm^2$. More than one pulse may be directed to the target zone of the substrate in some cases. Two or more pulses, for example five pulses or ten pulses may be directed to the target zone of the substrate in operation 206. The radiation is usually directed to the substrate surface at an angle greater than about 80 degrees, for example greater than about 85 degrees, and may be substantially perpendicular to the substrate surface.

At 208, a first gas mixture is introduced into the processing chamber to perform a first deposition process. The first gas mixture contains a first deposition precursor that adheres to the substrate surface. The first gas mixture may contain a semiconductor deposition precursor, such as a group IV precursor, for example a silicon-containing precursor and/or a germanium-containing precursor, a group III precursor, such as trimethyl aluminum, trimethyl gallium, trimethyl indium, and/or a borane (borane, diborane, triborane) or borazine, or a group V precursor such as phosphine, arsine, and/or ammonia. The first gas mixture may contain a group IV and a group III precursor or a group IV and a group V precursor. The first gas mixture may also include an inert component, such as argon, helium, hydrogen, or nitrogen as a diluent gas or a carrier gas. The first gas mixture is introduced as a pulse of gas that provides enough deposition precursor to cover the substrate with a monolayer of the precursor. The first precursor adheres to the substrate surface at an available adhesion site until all such sites are consumed, so the first deposition process is a self-limiting deposition process. The chamber is typically maintained at a temperature from about −10° C. to about 100° C. The resulting monolayer of the first deposition precursor is thought to have extreme uniformity due to the surface preparation performed prior to exposing the substrate to the first gas mixture.

At 210, a second pulse of laser radiation is directed to the target zone. The second pulse of laser radiation may be the same as the first pulse of laser radiation, or different from the first pulse of laser radiation in wavelength, duration, and/or fluence. The second pulse of laser radiation may be made of radiation from one laser, two lasers, or more lasers. In some cases, three or four lasers may be used. The second pulse of laser radiation may have a duration from about 10 nsec to about 50 microseconds, for example about 50 nsec or about 100 nsec. The second pulse may have a fluence between about 0.05 $J/cm^2$ and about 0.2 $J/cm^2$. More than one pulse may be directed to the target zone of the substrate in some cases. Two or more pulses, for example five pulses or ten pulses may be directed to the target zone of the substrate in operation 210. The radiation is usually directed to the substrate surface at an angle greater than about 80 degrees, for example greater than about 85 degrees, and may be substantially perpendicular to the substrate surface.

Optionally, at 212, the chamber may be purged with an inert gas to remove any remaining molecules of the first deposition precursor. The purge operation may be performed while exposing the target zone to the second pulse of laser radiation. In some cases, the inert gas may flow continuously from the introduction of the first gas mixture at 208 through the exposure to the second pulse of laser radiation at 210.

At 214, a second gas mixture is introduced into the processing chamber to perform a second deposition process. The second gas mixture may be the same as the first gas mixture or different from the first gas mixture in any aspect of flow rate or composition. The second gas mixture may contain a second deposition precursor that reacts with, or adheres to, the first deposition precursor arranged in a monolayer on the substrate. For example, the first gas mixture may include a silicon-containing precursor while the second gas mixture includes a germanium-containing precursor. In another aspect, the first gas mixture may contain a first silicon-containing precursor and the second gas mixture may contain a second silicon-containing precursor different from the first silicon-containing precursor. In another aspect, the first gas mixture may contain a first germanium-containing precursor and the second gas mixture may contain a second germanium-containing precursor different from the first germanium-containing precursor. In another aspect, the first gas mixture may contain a group III precursor and the second gas mixture may contain a group V precursor.

The substrate may be exposed to the second gas mixture for a time sufficient to react the second deposition precursor with the first deposition precursor to form a compound, if the first and second deposition precursors are different or contain mutually reactive species. The first deposition precursor may have removable substituents that are displaced by reaction with the second deposition precursor to form the compound. The reaction of the second deposition precursor with the first deposition precursor continues while molecules of the first deposition precursor are exposed. When all such molecules have been consumed by reaction with the second deposition precursor, the reaction stops, so the second deposition process is a self-limiting deposition process.

A second target zone may be identified, and the method 200 may be repeated at the second target zone. Subsequent target zones may be identified and treated according to the method 200 until all desired areas of the substrate are treated. The target zones may all be adjacent and/or overlapping, or some or all of the target zones may be spaced apart. In this way, a selective epitaxy process may be performed on only defined target zones, while areas of the substrate outside target zones are unmodified.

The methods 100 and 200 may be used to form channel layers for gate stacks in semiconductor devices. The channel layers formed by using the methods 100 and 200 typically have very uniform composition and crystal structure. A silicon layer may be formed using the methods 100 and 200 by using silane or disilane as a first deposition precursor and as a second deposition precursor. A germanium layer may be formed using germane or digermane as a first deposition precursor and as a second deposition precursor. A silicon-germanium layer may be formed by using a mixture of silicon-containing precursors and germanium-containing precursors for the first and second deposition precursors, or by using silicon-containing precursors for the first deposition precursor and germanium-containing precursors for the second deposition precursor. The composition of the silicon-germanium layer may be controlled by adjusting the silicon and germanium composition of the various precursors. Other mixed and compound semiconductor channel layers may be made similarly by including a subset of the elements making up the mixed semiconductor in the first deposition precursor and another subset of the elements in the second deposition precursor. The methods 100 and 200 may also be performed using more than two deposition precursors to make a channel layer, if desired.

The methods 100 and 200 may be repeated at a target location to form a layer having a target thickness. In the method 200, the repetition may begin at operation 206 of 208, resulting in exposing the deposited layer to laser radiation and then depositing a further layer on the substrate. In the method 100, the repetition may begin at operation 112. If desired, the target zone may be exposed to laser radiation prior to beginning a repetition at operation 112.

In one embodiment, the methods 100 and 200 may be practiced using a first precursor that is the same as the second precursor, or using a first precursor that deposits the same material as the second precursor. For example, the first and second precursors may be the same silane or different silanes such that silicon is deposited as an epitaxial layer. In another embodiment, the methods 100 and 200 may be practiced wherein the first precursor is a silane and the second precursor is ammonia to form a silicon nitride layer.

Figure 3:
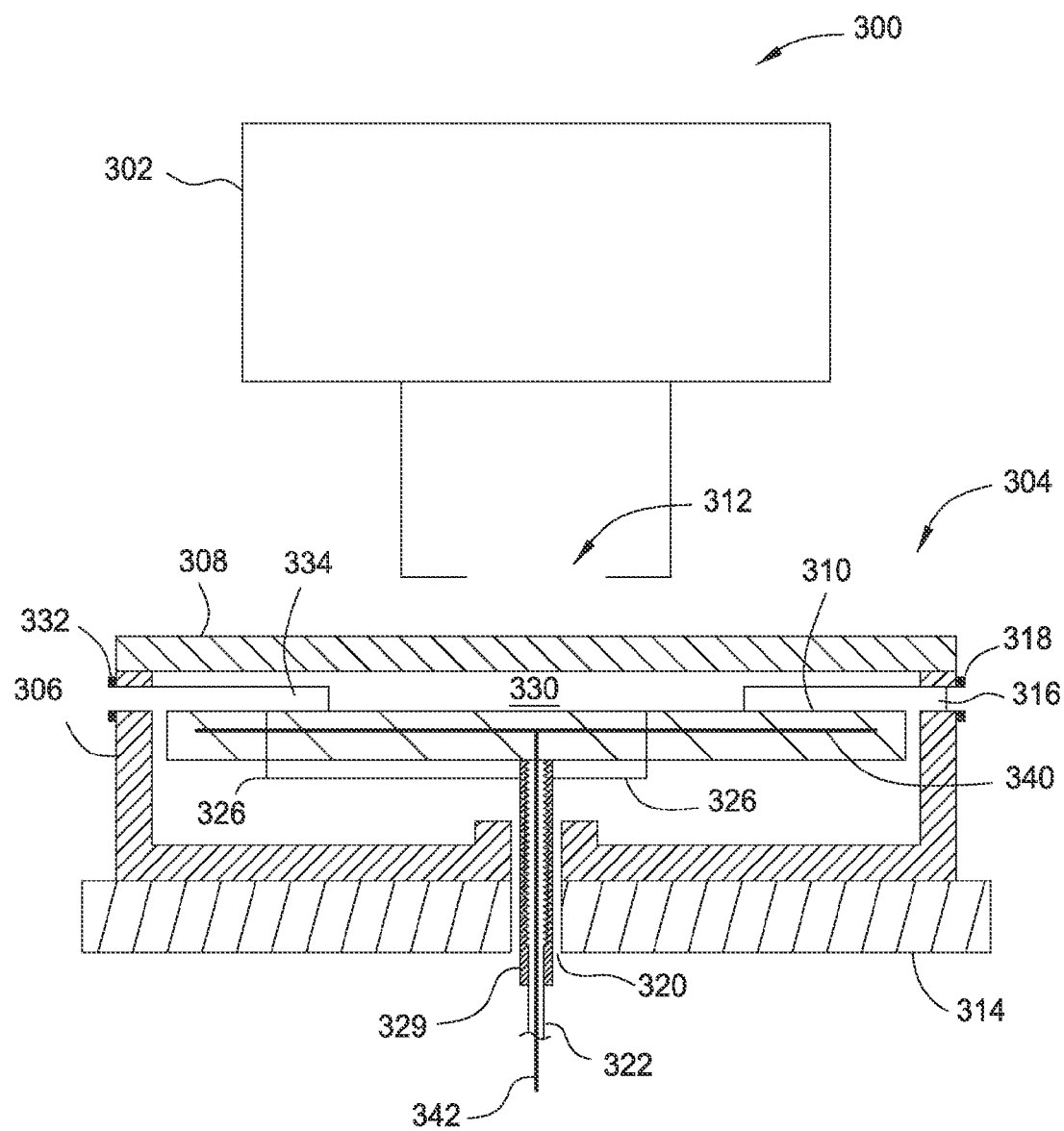
FIG. 3 is a schematic cross-sectional view of an apparatus according to one embodiment.

FIG. 3 is a schematic cross-sectional view of an apparatus 300 according to one embodiment. The apparatus 300 may be used to practice the methods 100 and 200. The apparatus 300 features a processing chamber 304 that has a wall 306 and a window 308 coupled to an upper portion of the wall 306, such that the wall 306 and the window 308 cooperatively define an internal volume 330 of the processing chamber 304. A substrate support 310 is disposed inside the processing chamber 304. The substrate support 310 may include a heating element 340, which may be a resistive heating element. The processing chamber 304 is disposed on a stage 314 that is movable in an x-y plane, so that the processing chamber 304 moves in the x-y plane.

A support shaft 322 extends from the substrate support 310 through an opening 320 that extends through the wall 306 of the processing chamber 304 and the stage 314. One or more lift pins 326 are disposed through the substrate support 310, and may be coupled to, and actuated by, a lift pin assembly 329 disposed around the support shaft 322, and extending through the wall 306 and the stage 314. Alternately, the lift pin assembly 329 may be omitted, and the lift pin 326 may hang from the substrate support 310. Two lift pins 326 are visible in the cross-sectional view of FIG. 3, but any number of lift pins may be used. Heat energy may be supplied to the heating element 340 through an energy conduit 342, for example an electrical conduit, disposed through the support shaft 322.

Process gases may be supplied to the processing chamber 304 through an inlet 332 fluidly coupled to an inlet plenum 334 that extends azimuthally around a portion of the periphery of the processing chamber 304. The gases may flow through the internal volume 330, across the substrate support 310, and may exit through an outlet plenum 316 fluidly coupled to an outlet 318.

A laser source 302 may be disposed facing the window 308 so that laser radiation emitted by the laser source 302 from an opening 312 passes through the window 308 and illuminates a region adjacent to the substrate support 310. When a substrate is disposed on the substrate support 310, and the apparatus 300 is activated, laser radiation emitted through the opening 312 passes through the window 308 and illuminates an area of the substrate.

The laser source 302 may include one or more pulsed lasers having a power rating, individually or collectively, of about 1 MW to about 50 MW. The one or more lasers may be solid state lasers, such as Nd:YAG, titanium sapphire, Nd:glass, and the like, operating from the near UV to near IR wavelengths, such as 532 nm or 1064 nm. Each pulsed laser of the laser source 302 may include a pulse generation means, such as a switch, for example a q-switch, shutter, Pockels cell, or delay loop, for generating laser pulses of duration from about 10 nsec to about 50 microseconds, for example about 50 nsec or about 100 nsec. Each pulse may have a fluence between about 0.05 J/cm$^2$ and about 0.2 J/cm$^2$.

The laser source 302 may also include an optical system for shaping the laser radiation emitted through the opening 312. The optical system may include one or more combiners, polarizers, homogenizers, mode scramblers, pulse stretchers, pulse shapers, and apertures for producing a uniform radiation field having a desired shape.

FIG. 4A is a schematic cross-sectional view of an apparatus 400 according to another embodiment. The apparatus 400 may be used to practice the methods 100 and 200. The apparatus 400 features a processing chamber 402, that has an enclosure 406 coupled to a stage 408. The stage 408 may be actuated in an x-y plane, so the stage 408 is optionally movable in the x-y plane. An upper part of the enclosure 406 is coupled to a lid 404. The lid 404 may be actuated in the x-y plane instead of, or in addition to, actuating the stage 408. The lid 404 and the enclosure 406 thus move with respect to each other.

A substrate support 410 is disposed inside the enclosure 406 and a support shaft 412 extends through an opening 414 extending through the enclosure 406 and the stage 408. Lift pins 416 are disposed through the substrate support 410 for engaging with a substrate on the substrate support 410 at a first end 418 of the lift pins 416. The lift pins 416 are secured in the stage 408 at a second end 420 of the lift pins 416. The lift pins 416 have a sealing means 422 around the second end 420 of each lift pin 416 for maintaining vacuum around the lift pins 416.

The lid 404 has a tunnel 424 in a central portion of the lid 404 for creating a processing zone adjacent to a target zone of a substrate disposed on the substrate support 410. A window 426 encloses the tunnel at a first end 428 thereof. The laser source 302 is disposed facing the window 426 to emit laser radiation through the window 426 and through the tunnel 424. The laser radiation emerges from the tunnel 424, through an opening at a second end 430 of the tunnel 424 opposite the first end 428, and illuminates a target zone of the substrate. The substrate is typically positioned a short distance from the second end 430 of the tunnel 424 to sharply define the target zone of the substrate.

Process gases are supplied to the tunnel 424, and the target zone of the substrate defined by the tunnel 424, through a gas inlet 432 formed in a wall 434 of the tunnel 424. One or more gas inlets 432 may be used. Two gas inlets 432 are visible in the embodiment of FIG. 4A. Process gases flow into the tunnel through the inlets 432 and toward the target zone of the substrate. The target zone of the substrate is thus exposed to the process gases and the laser radiation at the same time or at different times. For example, when practicing the methods 100 and 200 using the apparatus 400, the laser radiation may be directed through the tunnel 424 to the target zone to perform a thermal process on the target zone, and the process gases may be provided through the inlets 432 to perform a deposition process, such as an atomic layer epitaxy process, on the target zone.

Process gases and substrate off-gases are evacuated from the tunnel and the target zone through gas outlets 436 formed in the lid 404 at a location radially outward from the tunnel 424. Gases flow from the tunnel 424 to the target zone of the substrate and out of the target zone between the lid 404 and the substrate to reach the outlets 436. Providing the outlets 436 at a location radially outward from the tunnel 424 ensures that process gases contact the entire target zone of the substrate, defined by the tunnel 424. In this way, a laser-assisted atomic layer epitaxy process may be performed using the apparatus 400 because all sites in the target zone activated by the laser radiation are exposed to the process gases.

Figure 4B:
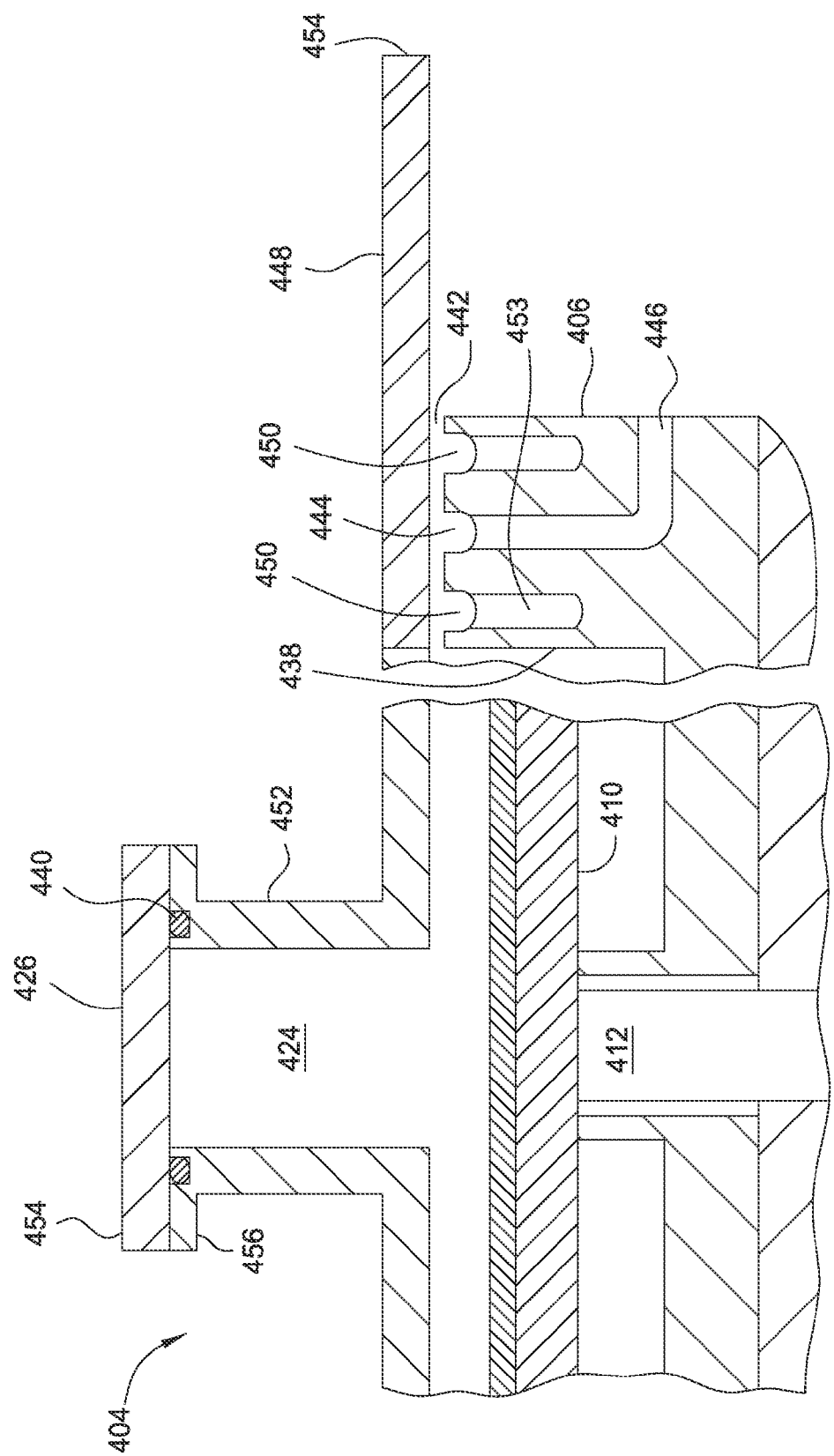
FIG. 4B is a close-up view of the apparatus of FIG. 4A.

FIG. 4B is a detailed view of the apparatus 400 at a different cross-section. A sidewall 438 of the enclosure 406 features a gas seal 442 between the sidewall 438 and a sealing surface 448 of the lid 404. An inlet conduit 446 formed through the sidewall 438 delivers a gas to a gas groove 444 to create a pressure between the sidewall 438 and the sealing surface 448. The gas flows from the gas groove 444 to two outlet grooves 450, each with a respective outlet plenum 453, and into an outlet which is not visible in the cross-section of FIG. 4B. The gas pressure between the sidewall 438 and the sealing surface 448 creates a seal that prevents gas flows between the interior of the enclosure and the ambient environment while allowing relative movement between the lid 404 and the processing chamber 402. Relative movement of the lid 404 and the processing chamber 402 enables positioning the tunnel 424 over any desired target zone of the substrate. The lid 404 is sized to maintain engagement of the sealing surface 448 and the sidewall 438 at any processing position of the tunnel 424 over the substrate. Thus, a minimum radial distance between a sidewall 452 of the tunnel and an edge 454 of the sealing surface 448, added to a diameter of the tunnel 424, is less than a diameter of the substrate.

A sealing member 440 is disposed between the sidewall 452 of the tunnel 424 and the window 426 to prevent gas flows between the interior of the tunnel 424 and the ambient environment, while gas flows from the tunnel 424, through the opening at the second end 430, which is formed in the sealing surface 448, to react with the surface of the substrate. The sealing member 440 may be a compliant member, such as an o-ring, and may be disposed in a groove formed in the sidewall 452, in the window 426, or both. A flange 456 may be provided on the sidewall 452 for clamping to a edge 454 of the window 426 to provide sealing pressure on the sealing member 440.

Figure 4C:
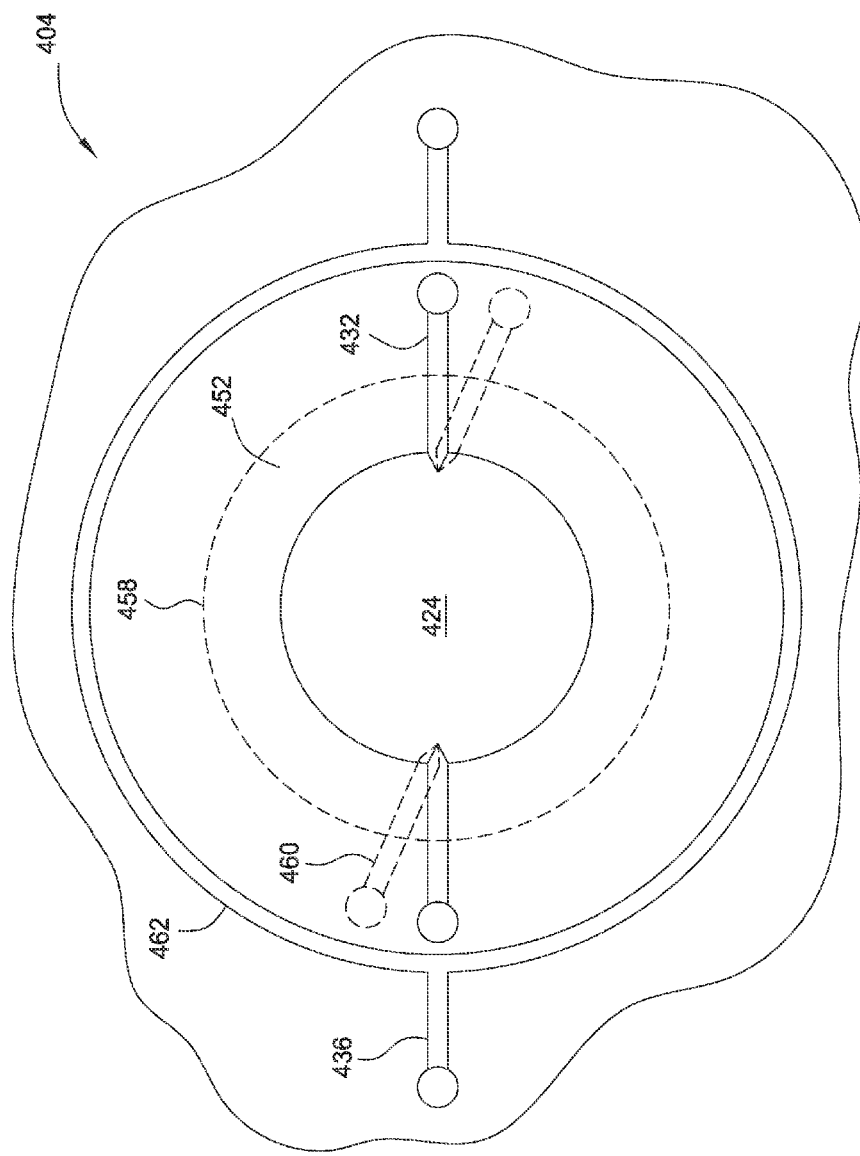
FIG. 4C is a top cross-sectional view of a portion of a lid according to one embodiment.

FIG. 4C is a top cross-sectional view of a portion of the lid 404. The gas inlets 432 are shown penetrating the sidewall 452 of the tunnel 424. The position of a outer radius 458 of the sidewall 452 is shown in phantom for reference. The outlets 436 are coupled to a pumping plenum 462 that surrounds the tunnel 424 and provides radial pumping of gases out of the tunnel 424. The gas inlets 432 and the gas outlets 436 are shown aligned in FIGS. 4A and 4B, but alignment is optional. The gas inlets 432 and the gas outlets 436 may have any relative position. If desired, a vortex flow may be created in the tunnel 424 by providing gas inlets 460 with a tangential alignment relative to the tunnel 424. The tangential gas inlets 460 may have any desired angle with respect to a radius of the tunnel 424 based on the desired vorticity of the gas flow in the tunnel 424.

Two gas inlets 432 (or 460) are shown, and two gas outlets 436 are shown in FIGS. 4A and 4B. Any number of gas inlets 432 (or 460) and gas outlets 436 may be used, from one up to a practical limit determined by the crowding of gas conduits around the tunnel 424. The gas inlets 432 are aligned in FIG. 4B, but the alignment is optional. The gas inlets 432 may be azimuthally displaced in any desired manner, and may be evenly or unevenly spaced around a circumference of the sidewall 452. The gas outlets 436 are shown aligned, as well, but the alignment of the gas outlets 436 is also optional. The gas outlets 436 may also be azimuthally displaced in any desired manner and may be evenly or unevenly spaced around a circumference of the pumping plenum 462. If flow uniformity is desired in an embodiment where the gas outlets 436 are unevenly spaced around the circumference of the pumping plenum 462, the individual gas outlets 436, and portions of the pumping plenum 462, may be sized to control flow and pressure drop, thus compensating for any flow non-uniformities in the tunnel 424 and adjacent to the pumping plenum 462.

Figure 4D:
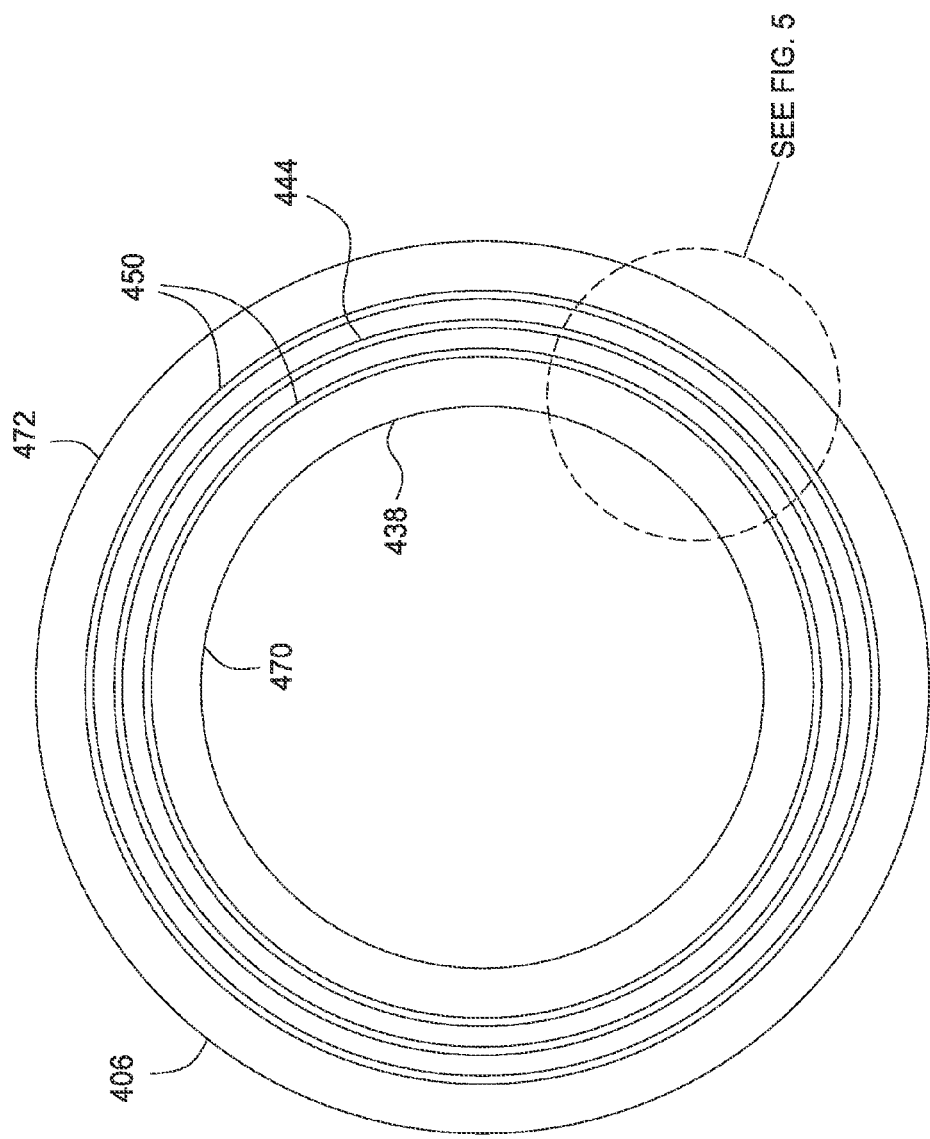
FIG. 4D is a top view of an enclosure of the apparatus of FIG. 4A showing an upper portion of a sidewall of the enclosure according to one embodiment.

FIG. 4D is a top view of the enclosure 406 showing the upper portion of the sidewall 438. The gas groove 444 and the outlet grooves 450 are shown in an equally spaced concentric arrangement, with the outlets grooves 450 spaced equally from the nearest radius of the sidewall 438. Thus, in the apparatus 400, the gas groove 444 has a radius that is midway between an inner radius 470 of the sidewall 438 and an outer radius 472 of the sidewall 438, with a first outlet groove 450 located radially inward of the gas groove 444 a first distance and a second outlet groove 450 located radially outward of the gas groove 444 a second distance. In the embodiment of FIGS. 4A and 4D, the first distance and the second distance are the same. If desired, the first distance and the second distance may be different, and may be selected to provide a flow characteristic to the sealing gas flow between the sidewall 438 and the sealing surface 448 (FIG. 4B) of the lid 404. For example, an inward radial flow bias may be created by making the second distance larger than the first distance. Likewise, an outward radial flow bias may be created by making the second distance smaller than the first distance. Sizing of the outlet grooves 450 may also be used to create a flow characteristic.

Figure 5:
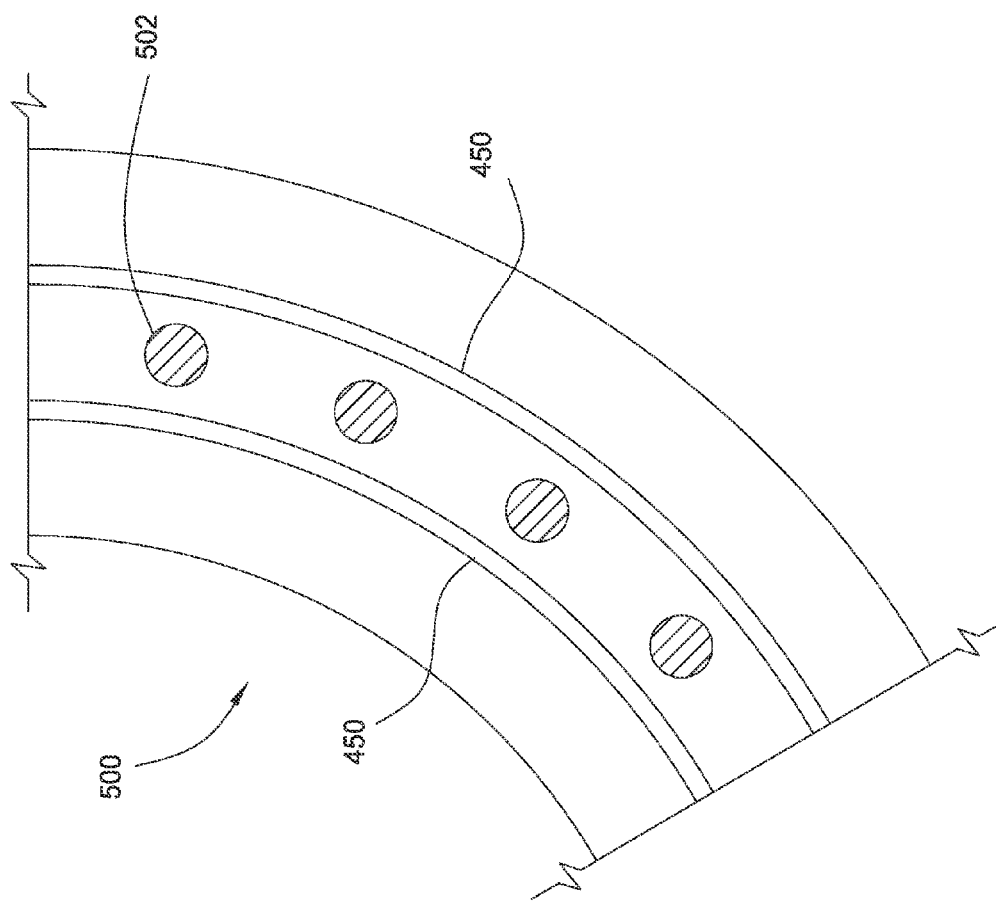
FIG. 5 is a top view of an enclosure sidewall according to another embodiment.

FIG. 5 is a top view of an enclosure sidewall 500 according to another embodiment. The enclosure sidewall 500 may be used as an alternative to the enclosure sidewall 438 of FIG. 4B. In the enclosure sidewall 500, discrete gas portals 502 are provided in place of the gas groove 444 of FIG. 4D. Sealing gas flows through the gas portals 502, between the enclosure sidewall 500 and the sealing surface 448 (FIG. 4B) and out through the outlet grooves 450.

Figure 6:
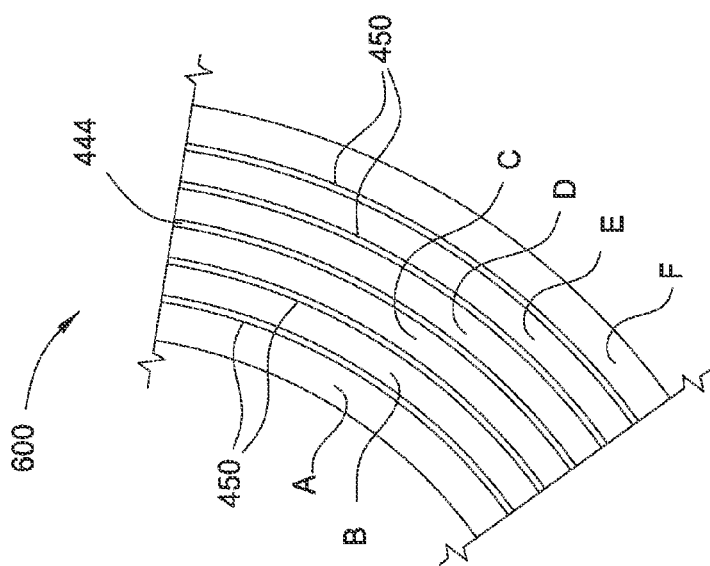
FIG. 6 is a top view of an enclosure sidewall according to another embodiment.

FIG. 6 is a top view of an enclosure sidewall 600 according to another embodiment. The enclosure sidewall 600 may be used as an alternative to the enclosure sidewall 438 of FIG. 4B and the enclosure sidewall 500 of FIG. 5. The enclosure sidewall 600 has a gas groove 444 and a plurality of outlet grooves 450 on either side of the gas groove 444. A first plurality of outlet grooves 450 is located radially inward of the gas groove 444 and a second plurality of outlet grooves 450 is located radially outward of the gas groove 444.

Figure 7:
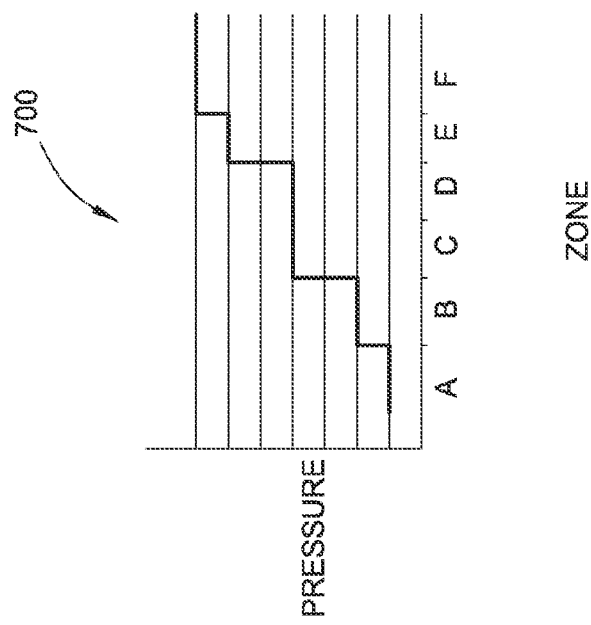
FIG. 7 is a graph showing a pressure profile of the enclosure sidewall of FIG. 6.

The enclosure sidewall 600 of FIG. 6 provides the capability to define a pressure profile between the sidewall 600 and the sealing surface 448 (FIG. 4B) of the lid 404. FIG. 7 is a graph 700 showing a pressure profile of the enclosure sidewall 600 of FIG. 6. The graph 700 shows how the sealing pressure between the sidewall 600 and the sealing surface 448 may be varied using the outlet grooves 450 of the sidewall 600. A vacuum source may be coupled to each of the outlet grooves 450 separately, and a different vacuum pressure may be applied at each outlet groove 450 to create a radial pressure profile between the sidewall 600 and the sealing surface 448. In the example of FIG. 7, a profile of increasing pressure from the inner radius of the sidewall 600 to the outer radius is shown. The gas groove 444 and the outlet grooves 450 operating at different pressures create a plurality of pressure zones A-F between the sidewall 600 and the sealing surface 448. Pressure zone A has a pressure similar to the pressure in the interior of the processing chamber 402. In the embodiment of FIG. 7, pressure zone B has a pressure higher than pressure zone A, pressure zone C higher than pressure zone B, pressure zone D higher than pressure zone C, and pressure zone E higher than pressure zone D. Pressure zone F is similar to ambient pressure outside the processing chamber 402.

A laser source will now be described that may be used to provide laser radiation for the embodiments described here.

Figure 8:
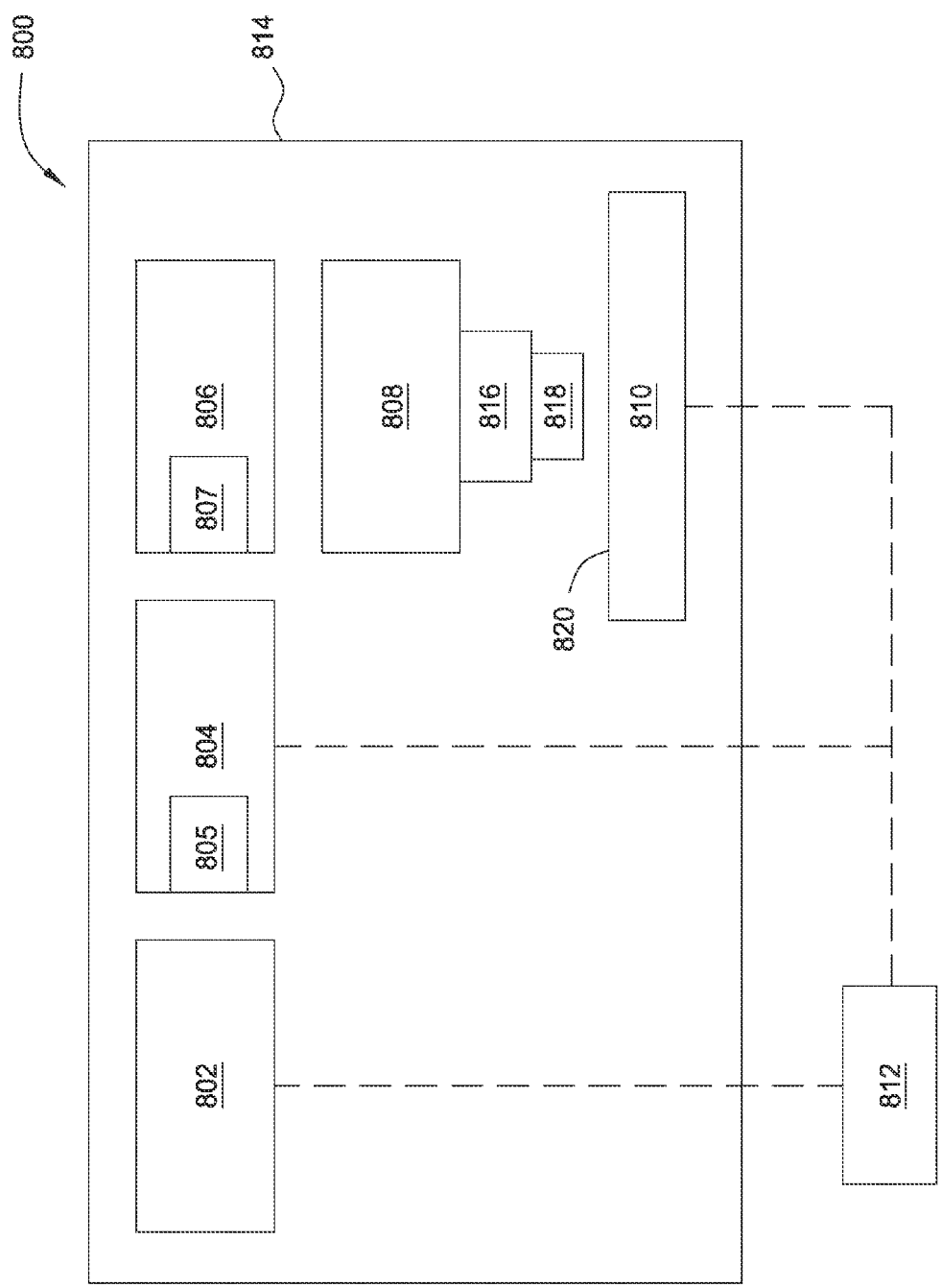
FIG. 8 is a plan view of a laser source for use in embodiments described herein.

FIG. 8 is a plan view of a laser source 800 for use in embodiments described herein. The laser source 800 comprises an energy module 802 that has a plurality of pulsed laser sources producing a plurality of laser pulses, a pulse control module 804 that combines individual pulsed laser pulses into combination pulsed laser pulses, and that controls intensity, frequency characteristics, and polarity characteristics of the combination pulsed laser pulses, a pulse shaping module 806 that adjusts the temporal profile of the pulses of the combined pulsed laser pulses, a homogenizer 808 that adjusts the spatial energy distribution of the pulses, overlapping the combination pulsed laser pulses into a single uniform energy field, and an aperture member 816 that removes residual edge non-uniformity from the energy field. Optionally, an alignment module 818 may be used that allows precision alignment of the laser energy field with a substrate disposed on a substrate support 810, which may be the substrate support 310 or 410. A controller 812 may be coupled to the energy module 802 to control production of the laser pulses, the pulse control module 804 to control pulse characteristics, and the substrate support 810 to control movement of the substrate with respect to the energy field. An enclosure 814 typically encloses the operative components of the laser source 800.

The lasers may be any type of laser capable of forming short pulses, for example duration less than about 100 nsec, of high power laser radiation. Typically, high modality lasers having over 500 spatial modes with $M^2$ greater than about 30 are used. Solid state lasers such as Nd:YAG, Nd:glass, titanium-sapphire, or other rare earth doped crystal lasers are frequently used, but gas lasers such as excimer lasers, for example $XeCl_2$, ArF, or KrF lasers, may be used. The lasers may be switched, for example by q-switching (passive or active), gain switching, or mode locking. A Pockels cell may also be used proximate the output of a laser to form pulses by interrupting a beam emitted by the laser. In general, lasers usable for pulsed laser processing are capable of producing pulses of laser radiation having energy content between about 100 mJ and about 10 J with duration between about 1 nsec and about 100 μsec, typically about 1 J in about 8 nsec. The lasers may have wavelength between about 200 nm and about 2,000 nm, such as between about 400 nm and about 1,000 nm, for example about 532 nm. In one embodiment, the lasers are q-switched frequency-doubled Nd:YAG lasers. The lasers may all operate at the same wavelength, or one or more of the lasers may operate at different wavelengths from the other lasers in the energy module 802. The lasers may be amplified to develop the power levels desired. In most cases, the amplification medium will be the same or similar composition to the lasing medium. Each individual laser pulse is usually amplified by itself, but in some embodiments, all laser pulses may be amplified after combining.

A typical laser pulse delivered to a substrate is a combination of multiple laser pulses. The multiple pulses are generated at controlled times and in controlled relationship to each other such that, when combined, a single pulse of laser radiation results that has a controlled temporal and spatial energy profile, with a controlled energy rise, duration, and decay, and a controlled spatial distribution of energy non-uniformity. The controller 812 may have a pulse generator, for example an electronic timer coupled to a voltage source, that is coupled to each laser, for example each switch of each laser, to control generation of pulses from each laser.

Figure 9A:
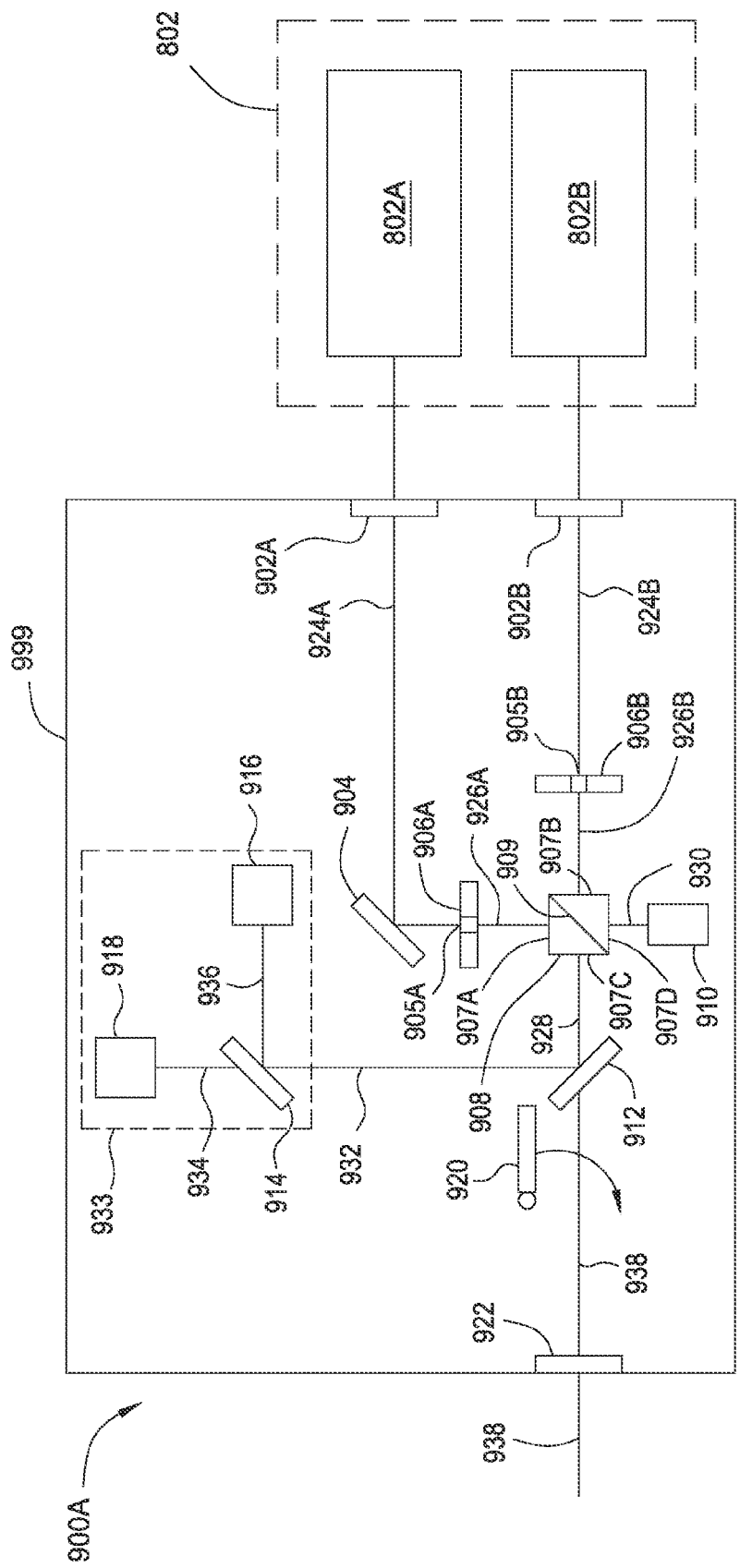
FIG. 9A is a plan view of a pulse controller of the laser source of FIG. 8 according to one embodiment.

The plurality of lasers are arranged so that each laser produces pulses that emerge into the pulse control module 804, which may have one or more pulse controllers 805. FIG. 9A is a plan view of a pulse controller 900A according to one embodiment. The one or more pulse controllers 805 described above in connection with FIG. 8 may each be a pulse controller such as the pulse controller 900A shown in FIG. 9A. Using optics contained in an enclosure 999 to prevent light pollution, the pulse controller 900A combines a first input pulse 924A received from the energy module 802 and a second input pulse 924B received from the energy module 802 into one output laser pulse 938. The two input laser pulses 924A, 924B enter the pulse controller 900A through input lenses 902A and 902B disposed in openings of the enclosure 999. In the embodiment of FIG. 9A, the two input lenses 902A, 924B are aligned along one surface of the enclosure 999, with the laser pulses 924A, 924B entering the enclosure 999 in a substantially parallel orientation.

The two input pulses 924A, 924B are directed to a combining optic 908 that combines the two pulses into one pulse 938. The combining optic has a first entry surface 907A oriented perpendicular to the entry path of the incident pulse 926A and a second entry surface 907B oriented perpendicular to the entry path of the incident pulse 926B to avoid any refraction of the input pulses 926A, 926B upon entering the combining optic 908. The combining optic 908 of FIG. 9A is a crystal that has a selecting surface 909 oriented such that first and second incident pulses 926A, 926B each strike the selecting surface 909 at an angle of approximately 45°. The selecting surface 909 interacts with light selectively depending on the properties of the light. The selecting surface 909 of the combining optic 908 may reflect the first incident pulse 926A and transmit the second incident pulse to create the combined pulse 928. To facilitate combination of the pulses, each of the incident pulses 926A, 926B may be tailored to interact with the selecting surface 909 in a particular way.

In one embodiment, the selecting surface 909 is a polarizing surface. The polarizing surface may have a linear axis of polarity, such that polarizing the incident pulse 926B parallel to the axis of the polarizing surface allows the incident pulse 926B to be transmitted by the polarizing surface, and polarizing the incident pulse 926A perpendicular to the axis of the polarizing surface allows the incident pulse 926A to be reflected by the polarizing surface. Aligning the two incident pulses 926A, 926B to the same spot on the polarizing surface creates the combined pulse 928 emerging from a first exit surface 907C of the combining optic 908 perpendicular to the surface 907C to avoid any refraction of the combined pulse 928. Alternately, the selecting surface 909 may be a circular polarizer, with the incident pulse 926A circularly polarized opposite the sense of the circular polarizer for reflection, and the incident pulse 926B circularly polarized in the same sense as the circular polarizer for transmission. In another embodiment, the incident pulses 926A, 926B may have different wavelengths, and the selecting surface 909 may be configured to reflect light of one wavelength and to transmit light of another wavelength, such as with a dielectric mirror.

In a polarization embodiment, polarization of the incident pulses 926A, 926B is accomplished using polarizing filters 906A, 906B. The polarizing filters 906A, 906B polarize the input pulses 924A, 924B to be selectively reflected or transmitted by the selecting surface 909 of the combining optic 908. The polarizing filters 906A, 906B may be wave plates, for example half-wave plates or quarter-wave plates, with polarizing axes oriented orthogonal to each other to produce the orthogonally polarized light for selective reflecting and transmission at the selecting surface 909. The axis of each polarizing filter 906A, 906B may be independently adjusted, for example with rotational actuators 905A, 905B, to precisely align the polarization of the incident pulses 926A, 926B with the polarization axis of the selecting surface 909, or to provide a desired angle of deviation between the polarization axis of an input pulse 926A, 926B and the polarization axis of the selecting surface 909.

Adjusting the polarization axis of the incident pulses 926A, 926B controls intensity of the combined pulse 928, because a polarizing filter transmits incident light according to Malus' Law, which holds that the intensity of light transmitted by a polarizing filter is proportional to the incident intensity and the square of the cosine of the angle between polarization axis of the filter and polarization axis of the incident light. Thus, rotating the polarizing filter 906A so that the polarization axis of the polarizing filter 906A deviates from an orientation perpendicular to the polarization axis of the selecting surface 909 results in a portion of the incident pulse 926A being transmitted through the selecting surface 909. Likewise, rotating the polarizing filter 906B so that its polarization axis deviates from an orientation parallel to the axis of the selecting surface 909 results in a portion of the incident pulse 926B being reflected from the selecting surface 909. This "non-selected" light from each of the incident pulses 926A, 926B is combined into a rejected pulse 930 that exits the combining optic 908 through a second exit surface 907D into a pulse dump 910. In this way, each of the polarizing filters acts as a dimmer switch to attenuate the intensity of pulses passing through the polarizing filters.

It should be noted that the two pulses 926A, 926B that are to be combined by the combining optic 908 are directed toward opposite sides of the selecting surface 909 for selective reflection and transmission. Thus, the first input pulse 924A is directed along a path that brings the first input pulse 924A toward a reflecting side of the selecting surface 909 by a reflector 904, while the second input pulse 924B is directed toward transmitting side of the selecting surface 909. Any combination of reflectors may naturally be used to steer light along a desired path within the pulse control module 804.

The combined pulse 928 interacts with a first splitter 912 that splits the combined pulse 928 into the output pulse 938 and a sampled pulse 932. The splitter 912 may be a partial mirror or a pulse splitter. The sampled pulse 932 is directed to a diagnostic module 933 that analyzes properties of the sampled pulse 932 to represent properties of the output pulse 938. In the embodiment of FIG. 9A, the diagnostic module 933 has two detectors 916 and 918 that detect the temporal shape of a pulse and the total energy content of a pulse, respectively. A second splitter 914 forms a first pulse 936 and a second pulse 934 for input to the respective detectors. The temporal shape detector 916 is an intensity monitor that signals intensity of light incident on the monitor in very short time scales. Light pulses incident on the temporal shape detector may have total duration from 1 picosecond (μsec) to 100 nsec, so the temporal shape detector, which may be a photodiode or photodiode array, renders intensity signals at useful subdivisions of these time scales. The energy detector 918 may be a pyroelectric device, such as a thermocouple, that converts incident electromagnetic radiation to voltage that can be measured to indicate the energy content of the second pulse 934. Because the first and second splitters 912 and 914 sample a known fraction of incident light based on the transmitting fraction of the first and second splitters 912 and 914, the energy content of the output pulse 938 may be calculated from the energy content of the second pulse 934.

Signals from the diagnostic module 933 may be routed to the controller 812 of FIG. 8, which may adjust the laser operation or the pulse control operation to achieve desired results. The controller 812 may adjust an electronic timer coupled to an active q-switch of each laser to control pulse timing in response to results from the temporal shape detector 916. Cycling the active q-switch faster makes shorter pulses, and vice versa. The controller 812 may be coupled to the rotational actuators 905A, 905B to adjust the intensity of the output pulse 938, based on results from the energy detector 918, by adjusting the polarization angle of light passing through the polarizing filters 906A, 906B. In this way, the duration and energy content of the output pulse 938 may be independently controlled. The controller 812 may also be configured to adjust power input to each laser.

The output pulse 938 may be interrupted by a shutter 920, if desired. The shutter 920 may be provided as a safety device in the event the laser energy emerging from the pulse control module 804 is to be interrupted to make an adjustment to a component subsequent to the pulse control module 804. The output pulse 938 exits the pulse control module 804 through an output lens 922.

The output pulse 938 is a combination of the two incident pulses 926A, 926B. As such the output pulse 938 has properties that represent a combination of the properties of the two incident pulses 926A, 926B. In the polarization example described above, the output pulse 938 may have an elliptical polarization representing the combination of two orthogonally polarized incident pulses 926A, 926B having different intensities according to the degree of transmission/reflection of each of the incident pulses 926A, 926B at the selecting surface 909. In an example using incident wavelength at the selecting surface 909 to combine two pulses, the output pulse 938 will have a wavelength representing the combined wavelength of the two incident pulses 926A, 926B according to their respective intensities.

For example, a 1,064 nm reflecting dielectric mirror may be disposed at the selecting surface 909 of the combining optic 908. The incident pulse 926A may have wavelength of approximately 1,064 nm with intensity A for reflecting from the selecting surface 909, and the incident pulse 926B may have a wavelength of 532 nm with intensity B for transmitting through the selecting surface 909. The combined pulse 928 will be a co-propagating bi-pulse of two photon types having the wavelengths and intensities of the incident pulses 926A, 926B, with total energy content that is the sum of the two pulse energies.

FIGS. 9B and 9C are schematic views showing embodiments that have multiple pulse controllers 900A, 900B. In the embodiment of FIG. 9B, two pulse controllers of the configuration of the pulse controller 900A of FIG. 9A are aligned with four energy sources 802A-D to form two combined pulses 938. In the embodiment of FIG. 9C, two combined pulses 938 are formed having a desired distance "d" between them. Two pulse controllers 900C, 900D accept input pulses from two energy sources 802A and 802C along the plane of FIG. 9B and perpendicular to the plane of FIG. 9C from two energy sources not visible in the view of FIG. 9C. The two pulse controllers 900C, 900D are the same as the pulse controller 900B, with the following differences.

The pulse controller 900D is configured to direct an output pulse 944 through an output lens 946 using an output reflector 954. The output lens 946 directs the output pulse 944 into an input lens 948 of the pulse controller 900C to a reflector 950 and an output lens 952 of the pulse controller 900C. In this way, the two output pulses 938 may be positioned any desired distance "d" from each other on exiting the pulse control module 804 (FIG. 8). For most embodiments, the distance "d" will be between about 1 mm and about 1,000 mm, for example about 35 mm.

One or more pulses exit the pulse control module 804 and enter the pulse shaping module 806, which has one or more pulse shapers 807, as shown schematically in FIG. 8.

Figure 10:
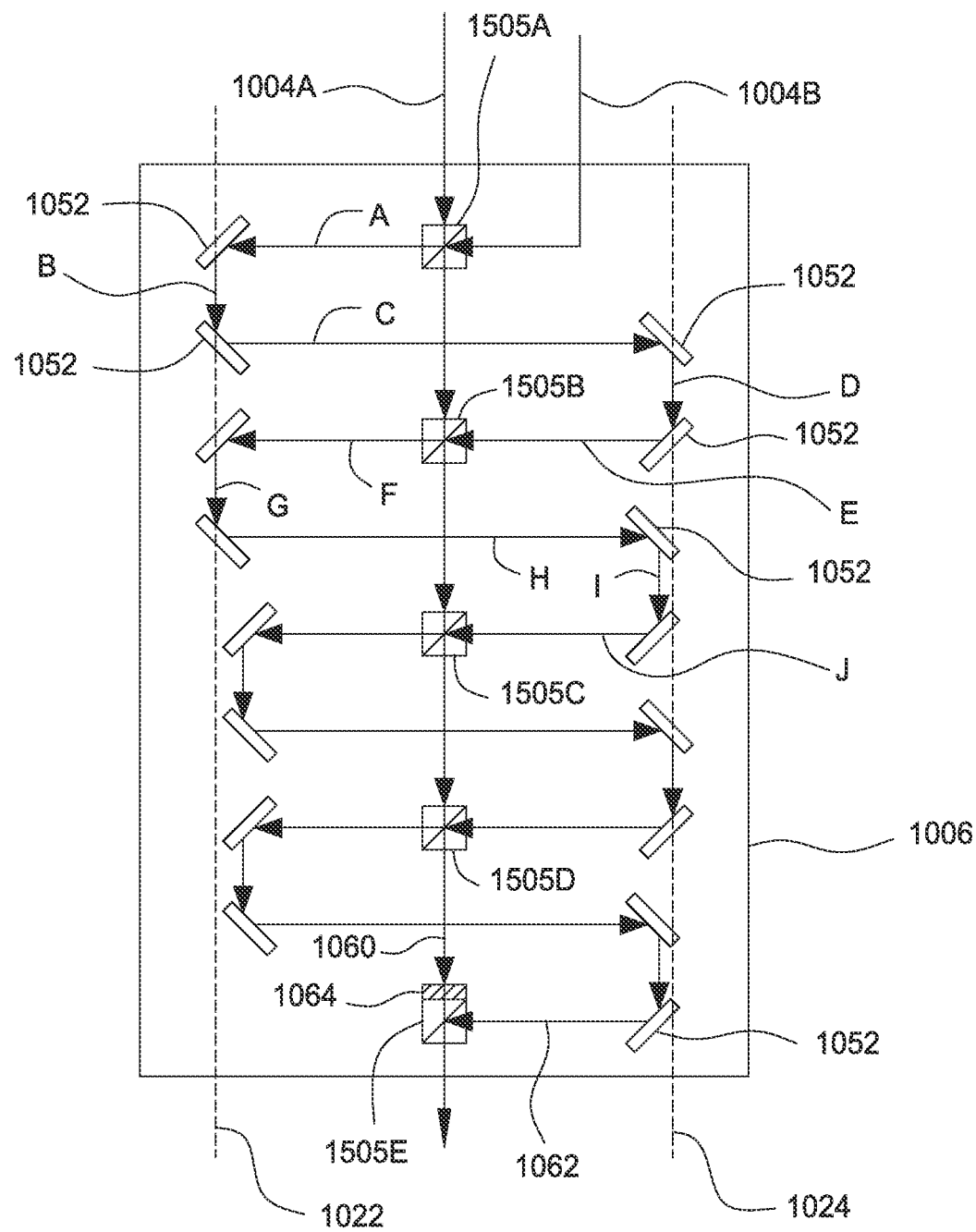
FIG. 10 is a schematic illustration of one embodiment of a pulse shaper of the laser source of FIG. 8.

FIG. 10 is a schematic illustration of one embodiment of a pulse shaper 1006. The one or more pulse shapers 807 of the pulse shaping module 806 may each be a pulse shaper such as the pulse shaper 1006. The pulse shaper of FIG. 10 may comprise a plurality of mirrors 1052 (e.g., 16 mirrors are shown) and a plurality of splitters (e.g., reference numerals 1050A-1050E) that are used to delay portions of a laser energy pulse to provide a composite pulse that has a desirable characteristics (e.g., pulse width and profile). In one example, a first laser energy pulse 1004A entering the pulse shaping module 1006 may be spatially coherent. The first laser energy pulse 1004A is split into two components, or sub-pulses, that follow path A after passing through the first splitter 1050A. Neglecting losses in the various optical components, depending on the transmission to reflection ratio in the first splitter 1050A, a percentage of the laser energy (i.e., X %) of the first laser energy pulse 1004A is transferred directly to the second splitter 1050B, and a remaining percentage of the energy (i.e., 1–X %) of the first laser energy pulse 1004A follows a path A-E (i.e., segments A-E) as it is reflected by multiple mirrors 1052 before it strikes the second splitter 1050B.

In one example, the transmission to reflection ratio of the first splitter 1050A is selected so that 70% of the pulse's energy is reflected and 30% is transmitted through the splitter. In another example the transmission to reflection ratio of the first splitter 1050A is selected so that 50% of the pulse's energy is reflected and 50% is transmitted through the splitter. The length of the path A-E, or sum of the lengths of the segments A-E (i.e., total length=A+B+C+D+E as illustrated in FIG. 10), will control the delay between the portion of the first laser energy pulse 1004A transmitted directly to the second splitter 1050B and the portion routed along path A-E. In general by adjusting the difference in path length between the pulse segments a delay of about 3.1 nanoseconds (ns) per meter of path length difference can be realized.

The energy delivered to the second splitter 1050B is split into a portion that is directly transmitted to the third splitter 1050C and a portion that follows the path F-J before it strikes the third splitter 1050C. This process of splitting and delaying portions continues at subsequent splitters (i.e., reference numerals 1050D-E) and mirrors 1052 until they are all recombined in the final splitter 1050E that is adapted to primarily deliver energy to the next component in the laser source 800. The final splitter 1050E may be a polarizing splitter that adjusts the polarization of the energy in the sub-pulses received from the delaying regions or from the prior splitter so that it can be directed in a desired direction.

In one embodiment, a waveplate 1064 is positioned before a polarizing type of final splitter 1050E so that its polarization can be rotated for the sub-pulses following path 1060. Without the adjustment to the polarization, a portion of the energy will be reflected by the final pulse splitter and not get recombined with the other branch. In one example, all energy in the pulse shaper 1006 is S-polarized, and thus the non-polarizing cube splitters divide incoming pulses, but the final splitter, which is a polarizing cube, combines the energy that it receives. The energy in the sub-pulses following path 1060 will have its polarization rotated to P, which passes straight through the polarizing pulse splitter, while the other sub pulses following path 1062 are S-polarized and thus are reflected to form a combined pulse.

In one embodiment, the final pulse splitter 1050E comprises a non-polarizing splitter and a mirror that is positioned to combine the energy received from the delaying regions or from the prior splitter. In this case, the splitter will project part of the energy towards a desired point, transmit another part of the energy received towards the desired point, and the mirror will direct the remaining amount of energy transmitted through the splitter to the same desired point. One will note that the number of times the pulse is split and delayed may be varied by adding pulse splitting type components and mirrors in the configuration as shown herein to achieve a desirable pulse duration and a desirable pulse profile. While FIG. 10 illustrates a pulse shaper design that utilizes four pulse delaying regions with splitters and mirrors, this configuration is not intended to be limiting.

In the pulse shaper 1006 of FIG. 10, at least some of the reflectors 1052 are displaced from a datum 1022 or 1024 to vary the optical path of light through the pulse shaper 1006. The displacement of a mirror may be set a desired distance "x" to achieve a certain temporal displacement for a sub-pulse. Typically the mirrors will be displaced in pairs, each mirror in a given mirror pair having a nearly identical displacement from the datum. The displacements of pairs of mirrors may naturally be different to achieve any desired pulse shape. In one embodiment, the displacement $x_1$ of a first mirror pair is about 10 mm, the displacement $x_2$ of a second mirror pair is about 7.5 mm, the displacement $x_3$ or a third mirror pair is about 20 mm, and the displacement $x_4$ of a fourth mirror pair is about 15 mm.

A second pulse 1004B may be routed to the pulse shaper 1006 of FIG. 10. The first and second pulses 1004A, 1004B may be the output pulses 938 of FIGS. 9B and 9C. The second pulse 1004B is similarly split, delayed, and recombined at the final splitter 1050E to form a combined pulse that is substantially temporally decorrelated.

In another embodiment, all pulses emanating from a plurality of lasers may be directed into a pulse shaper without passing through a combiner first. Optics may be used to bring the pulses into close physical proximity such that they all strike the first splitter 1050A of the pulse shaper 1006. The pulses may be arranged in a configuration, for example a square configuration, having a dimension less than a cross-sectional dimension of the first splitter 1050A of the pulse shaper 1006, such that the pulses all travel through the first splitter 1050A.

Figure 11:
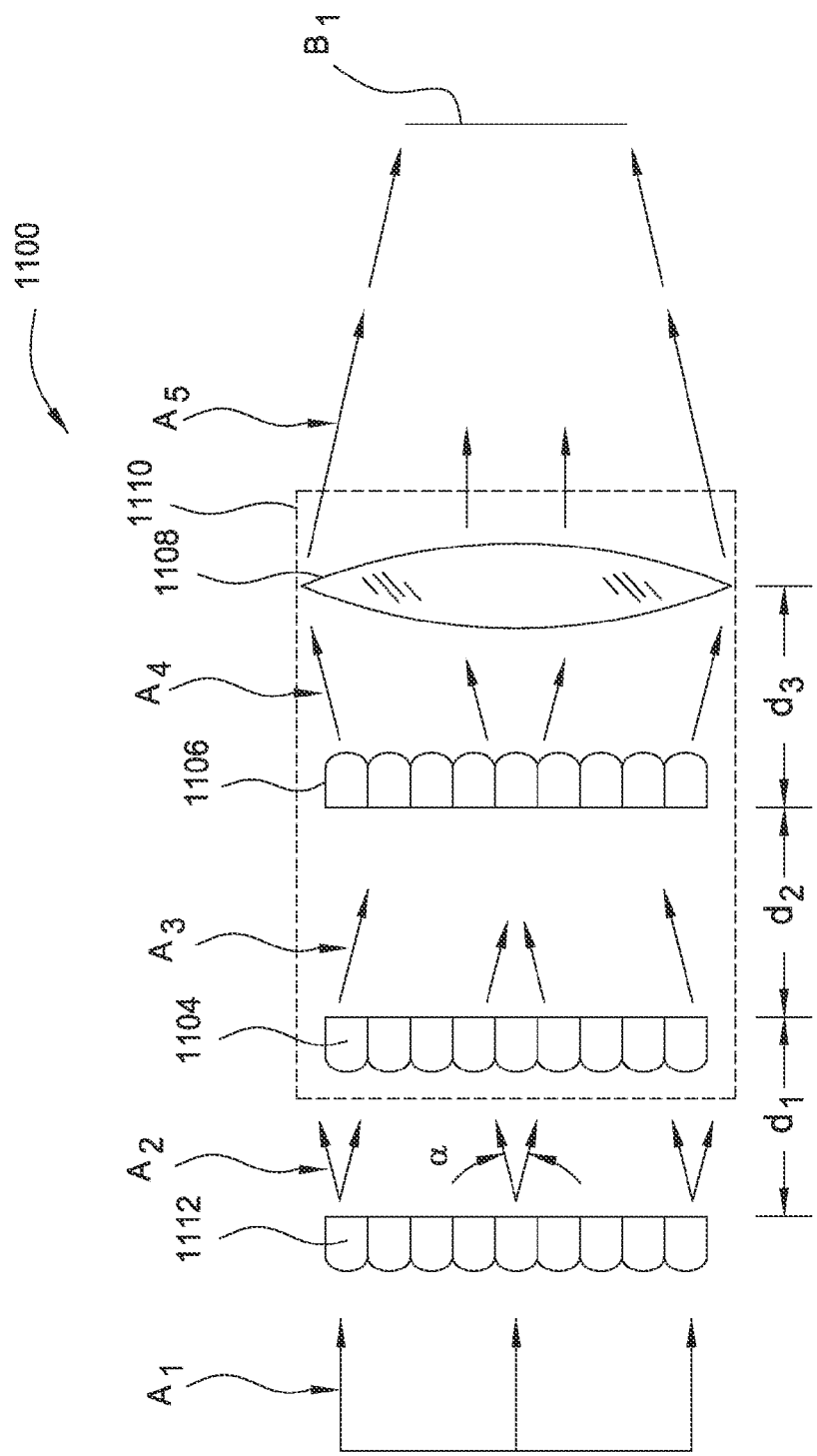
FIG. 11 is a schematic view of a homogenizer of the laser source of FIG. 8 according to one embodiment.

Shaped pulses from the pulse shaping module 806 are routed into a homogenizer 808. FIG. 11 is a schematic view of a homogenizer 1100 according to one embodiment. The homogenizer 808 of FIG. 8 may be the homogenizer 1100 of FIG. 11. A beam integrator assembly 1110 contains a pair of micro-lens arrays 1104 and 1106 and a lens 1108 that homogenize the energy passing through this integrator assembly. It should be noted that the term micro-lens array, or fly's-eye lens, is generally meant to describe an integral lens array that contains multiple adjacent lenses. The beam integrator assembly 1110 generally works best using an incoherent source or a broad partially coherent source whose spatial coherence length is much smaller than a single micro-lens array's dimensions. In short, the beam integrator assembly 1110 homogenizes the beam by overlapping magnified images of the micro-lens arrays at a plane situated at the back focal plane of the lens 1108. The lens 1108 may be corrected to minimize aberrations including field distortion.

The size of the image field is a magnified version of the shape of the apertures of the first microlens array, where the magnification factor is given by $F/f_1$ where $f_1$ is the focal length of the microlenses in the first micro-lens array 1104 and F is the focal length of lens 1108. In one example, a lens 1108 that has a focal length of about 175 mm and a micro-lenses in the micro-lens array have a 4.75 mm focal length is used to form an 11 mm square field image.

Although many different combinations for these components can be used, generally the most efficient homogenizers will have a first micro-lens array 1104 and second micro-lens array 1106 that are identical. The first micro-lens array 1104 and second micro-lens array 1106 are typically spaced a distance apart so that the energy density (Watts/mm$^2$) delivered to the first micro-lens array 1104 is increased, or focused, on the second micro-lens array 1106. This can cause damage, however, to the second micro-lens array 1106 if the energy density exceeds the damage threshold of the optical component and/or optical coating placed on the optical components. Typically the second micro-lens array 1106 is spaced a distance $d_2$ from the first micro-lens array 1104 equal to the focal length of the lenslets in the first micro-lens array 1104.

In one example, each the micro-lens arrays 1104, 1106 contains 7921 micro-lenses (i.e., 89×89 array) that are a square shape and that have an edge length of about 300 microns. The lens 1108, which may be a Fourier lens, is generally used to integrate the image received from the micro-lens arrays 1104, 1106 and is spaced a distance $d_3$ from the second micro-lens array 1106.

In applications where coherent or partially coherent sources are used, various interference and diffraction artifacts can be problematic when using a beam integrator assembly 1110, since they create high intensity regions, or spots, within the projected beam's field of view, which can exceed the damage threshold of the various optical components. Therefore, due to the configuration of the lenses or the interference artifacts, the useable lifetime of the various optical components in the beam integrator assembly 1110 and system has become a key design and manufacturing consideration.

A third micro-lens array 1112 may be placed in front of or within the beam homogenizer assembly 1100 so that the uniformity of outgoing energy $A_5$ is improved in relation to the incoming energy $A_1$. In this configuration, the incoming energy $A_1$ is diffused by the placement of the third micro-lens array 1112 prior to the energy $A_2$, $A_3$ and $A_4$ being received and homogenized by the first micro-lens array 1104, second micro-lens array 1106 and lens 1108, respectively. The third micro-lens array 1112 will cause the pulse of incoming energy ($A_1$) to be distributed over a wider range of angles ($\alpha_1$) to reduce the contrast of the projected beam and thus improve the spatial uniformity of the pulse. The third micro-lens array 1112 generally causes the light passing through it to spread out so that the irradiance (W/cm$^2$) of energy $A_3$ received by the second micro-lens array 1106 is less than without the third micro-lens array 1112. The third micro-lens array 1112 is also used to decorrelate the phase of the beam striking the first and second micro-lens arrays 1104 and 1106. This additional phase decorrelation improves the spatial uniformity by spreading out the high intensity spots observed without the diffuser. In general, the third micro-lens array 1112 operates as a narrow angle optical diffuser that is selected so that it will not diffuse the received energy in a pulse at an angle greater than the acceptance angle of the lens that it is placed before.

In one example, the third micro-lens array 1112 is selected so that the diffusion angle $\alpha_1$ is less than the acceptance angle of the micro-lenses in the first micro-lens array 1104 or the second micro-lens array 1106.

Referring again to FIG. 8, energy from the homogenizer 808 is typically arranged in a pattern, such as a square or rectangular shape, that approximately fits an area to be annealed on the surface of a substrate. The processing and rearranging applied to the energy results in an energy field having intensity that varies from an average value by no more than about 15%, such as less than about 12%, for example less than about 8%. Near the edges of the energy field, however, more significant non-uniformities may persist due to various boundary conditions throughout the apparatus. These edge non-uniformities may be removed using an aperture member 816. The aperture member 816 is typically an opaque object having an opening through which the energy may pass in cross-section shaped like the opening.

FIG. 12A is a side view of an aperture member 1200 according to one embodiment. The aperture member 816 of FIG. 8 may be the aperture member 1200 of FIG. 12A. The aperture member 1200 has a first member 1202 that is substantially transparent to selected forms of energy, such as light or laser radiation having a selected wavelength. An energy blocking member 1204, which may be opaque or reflective, is formed over a portion of a surface of the first member 1202 defining an opening 1208 through which energy will pass in the shape of the opening 1208. A second member 1206 is disposed over the first member 1202 and the energy blocking member 1204, covering the opening 1208. The second member 1206 is also substantially transparent to the energy to be transmitted through the aperture member 1200, and may be the same material as the first member 1202. The edges of the aperture member 1200 are enclosed by a covering 1210 that ensures particulates do not enter the opening 1208.

The aperture member 1200 is positioned such that the energy blocking member 1204 is at a focal plane 1212 of the energy incident on the aperture member 1200, ensuring a precise truncation of the energy field. Because the opening 1208 is positioned at the focal plane of the energy, any particles that collect in the opening, for example on the surface of the first member 1202, cast shadows in the transmitted energy field that lead to non-uniform processing of a substrate. Covering the opening 1208 with the second member 1206 and enclosing the edges of the aperture member 1200 ensures that any particles adhering to the aperture member 1200 are far enough from the focal plane to be out of focus in the final energy field so that variation in intensity of the final energy field due to the shadows of the particles is reduced.

The first and second members 1202 and 1206 are typically made from the same material, usually glass or quartz. The energy blocking member 1204 may be an opaque or reflective material, such as metal, white paint, or a dielectric mirror. The energy blocking member 1204 may be formed and shaped, and the formed and shaped energy blocking member 1204 applied to the first member 1202 using an appropriate adhesive, such as Canada balsam. Alternately, the energy blocking member 1204 may be deposited on the first member 1202 and then etched to provide the opening 1208. The second member 1206 is typically applied to the energy blocking member 1204 using adhesive.

The covering 1210 may be a material that is permeable or impermeable to gases. The covering may be an adhesive or a hard material applied using an adhesive. Alternately, the covering may be formed by melt-fusing the edges of the first and second members 1202 and 1206 with the edge of the energy blocking member 1204.

To avoid refractive effects of the aperture member 1200, the side walls of the opening 1208, defined by an interior edge 1214 of the energy blocking member 1204, may be tapered, angled, or slanted to match the propagation direction of photons emerging from the homogenizer 808.

FIG. 12B is a side view of an aperture member 1220 according to another embodiment. The aperture member 816 of FIG. 8 may be the aperture member 1220 of FIG. 12B. The aperture member 1220 is the same as the aperture member 1200 of FIG. 12A, except that the aperture member 1220 has no central opening 1208. The aperture member 1220 comprises a transmissive member 1222 with the energy blocking member 1204 embedded therein. Reducing the number of interfaces between different media in the aperture member 1220 may reduce refractive effects. The interior edge 1214 of the energy blocking member 1204 is shown tapered in the embodiment of FIG. 12B, as described above in connection with FIG. 12A.

The aperture member 1220 of FIG. 12B may be made by etching or grinding an annular shelf around a central dais of a first transmissive member, adhering an annular energy blocking member to the annular shelf, and then adhering a second transmissive member to the energy blocking member and the central dais of the first transmissive member, using an optically inactive adhesive such as Canada balsam. Alternately, the energy blocking member may be adhered to a first transmissive member having no central dais, and the second transmissive member formed by depositing a material over the energy blocking member and the exposed portion of the first transmissive member, filling the central opening with transmissive material. Deposition of transmissive materials is well-known in the art, and may be practiced using any known deposition or coating process.

Aperture members may vary in size. An aperture member having a smaller aperture may be positioned proximate an aperture member having a larger aperture to reduce the size of the transmitted energy field. The smaller aperture member may be removed again to utilize the larger aperture. Multiple aperture members having different sizes may be provided to allow changing the size of the energy field to anneal areas having different sizes. Alternately, a single aperture member may have a variable aperture size. Two rectangular channels may be formed in a transparent housing, and two pairs of opaque or reflective actuated half-plates disposed in the rectangular channels such that a pair of half-plates meets in a central portion of the transparent housing. The pairs of half-plates may be oriented to move along orthogonal axes so that a rectangular aperture of variable size may be formed by moving each pair of half-plates closer together or further apart within the rectangular channels.

The aperture members 1200 and 1220 may magnify or reduce the image of the light passing through the aperture in any desired way. The aperture members may have magnification factor of 1:1, which is essentially no magnification, or may reduce the image in size by a factor of between about 1.1:1 and about 5:1, for example, about 2:1 or about 4:1. Reduction in size may be useful for some embodiments because the edges of the imaged energy field may be sharpened by the size reduction. Magnification by a factor between about 1:1.1 and about 1:5, for example about 1:2, may be useful in some embodiments to improve efficiency and throughput by increasing coverage area of the imaged energy field.

Thermal energy is coupled into a substrate disposed on a work surface of a substrate support using methods disclosed herein. The thermal energy is developed by applying electromagnetic energy at an average intensity between about 0.02 J/cm$^2$ and about 1.0 J/cm$^2$, for example between about 0.02 J/cm$^2$ and about 0.5 J/cm$^2$, to successive portions of the surface of a substrate in short pulses of duration between about 1 nsec and about 100 nsec, such as between about 5 nsec and about 50 nsec, for example about 10 nsec. A plurality of such pulses may be applied to each portion of the substrate, with a duration between the pulses between about 500 nsec and about 1 msec, such as between about 1 μsec and about 500 μsec, for example about 100 μsec, to allow complete dissipation of the thermal energy through the substrate before the next pulse arrives. The energy field typically covers an area of between about 0.1 cm$^2$ and about 10.0 cm$^2$, for example about 6 cm$^2$, resulting in a power delivery of between about 0.2 MW and about 10 GW with each pulse. In most applications, the power delivered with each pulse will be between about 10 MW and about 500 MW. The power density delivered is typically between about 2 MW/cm$^2$ and about 1 GW/cm$^2$, such as between about 5 MW/cm$^2$ and about 100 MW/cm$^2$, for example about 10 MW/cm$^2$. The energy field applied in each pulse has spatial standard deviation of intensity that is no more than about 4%, such as less than about 3.5%, for example less than about 3.0%, of the average intensity.

Delivery of the high power and uniformity energy field mostly desired for annealing of substrates may be accomplished using the energy source 802 with a plurality of lasers emitting radiation readily absorbed by the substrate to be annealed. In one aspect, laser radiation having a wavelength of about 532 nm is used, based on a plurality of frequency-doubled Nd:YAG lasers. Four such lasers having individual power output about 50 MW may be used together for suitable annealing of a silicon substrate.

Pulses of energy may be formed by interrupting generation or propagation of a beam of energy. A beam of energy may be interrupted by disposing a fast shutter across an optical path of the beam. The shutter may be an LCD cell capable of changing from transparent to reflective in 10 nsec or less on application of a voltage. The shutter may also be a rotating perforated plate wherein size and spacing of the perforations are coupled with a selected rate of rotation to transmit energy pulses having a chosen duration through the openings. Such a device may be attached to the energy source itself or spaced apart from the energy source. An active or passive q-switch, or a gain switch may be used. A Pockels cell may also be positioned proximate to a laser to form pulses by interrupting a beam of laser light emitted by the laser. Multiple pulse generators may be coupled to an energy source to form periodic sequences of pulses having different durations, if desired. For example, a q-switch may be applied to a laser source and a rotating shutter having a periodicity similar to that of the q-switch may be positioned across the optical path of the pulses generated by the q-switched laser to form a periodic pattern of pulses having different durations.

Self-correlation of the pulses is reduced by increasing the number of spatial and temporal modes of the pulses. Correlation, either spatial or temporal, is the extent to which different photons are related in phase. If two photons of the same wavelength are propagating through space in the same direction and their electric field vectors point the same direction at the same time, those photons are temporally correlated, regardless of their spatial relationship. If the two photons (or their electric field vectors) are located at the same point in a plane perpendicular to the direction of propagation, those two photons are spatially correlated, regardless of any temporal phase relationship.

Correlation is related to coherence, and the terms are used almost interchangeably. Correlation of photons gives rise to interference patterns that reduce uniformity of the energy field. Coherence length is defined as a distance beyond which coherence or correlation, spatial or temporal, falls below some threshold value.

Photons in pulses can be temporally decorrelated by splitting a pulse into a number of sub-pulses using a succession of splitters, and routing each sub-pulse along a different path with a different optical path length, such that the difference between any two optical path lengths is greater than a coherence length of the original pulse. This largely ensures that initially correlated photons likely have different phase after the different path lengths due to the natural decline in coherence with distance travelled. For example, Nd:YAG lasers and Ti:sapphire lasers typically generate pulses having a coherence length of the order of a few millimeters. Dividing such pulses and sending parts of each pulse along paths having length differences more than a few millimeters will result in temporal decorrelation. Sending sub-pulses along multi-reflective paths with different lengths is one technique that may be used. Send sub-pulses along multi-refractive paths with different effective lengths defined by different refractive indices is another technique. The pulse shaping module described in connection with FIG. 10 may be used for temporal decorrelation of pulses.

Spatial decorrelation may be achieved by creating an energy field from a pulse and overlapping portions of the energy field. For example, portions of an energy field may be separately imaged onto the same area to form a spatially decorrelated image. This largely ensures that any initially correlated photons are spatially separated. In one example, a square energy field may be divided into a checkerboard-style 8×8 sampling of square portions, and each square portion imaged onto a field the same size as the original energy field such that all the images overlap. A higher number of overlapping images decorrelates the energy more, resulting in a more uniform image. The homogenizer 1100 FIG. 11 may be useful in spatially decorrelating pulses.

A laser pulse imaged after the decorrelation operations described above generally has a cross-section with uniform energy intensity. Depending on the exact embodiment, the cross-sectional energy intensity of a pulsed energy field treated according to the above processes may have a standard deviation of about 3.0% or less, such as about 2.7% or less, for example about 2.5%. An edge region of the energy field will exhibit a decaying energy intensity that may decay by 1/e along a dimension that is less than about 10% of a dimension of the energy field, such as less than about 5% of the dimension of the energy field, for example less than about 1% of the energy field. The edge region may be truncated using an aperture, such as the aperture members 1200 and 1220 of FIGS. 12A and 12B, or may be allowed to illuminate a substrate outside a treatment zone, for example in a kurf space between device areas on a substrate.

If the energy field is truncated, an aperture member is typically positioned across the optical path of the pulses to trim the non-uniform edge regions. To achieve clean truncation of the image, the aperture is located near a focal plane of the energy field. Refractive effects of the aperture interior edge may be minimized by tapering the aperture interior edge to match a direction of propagation of photons in the pulse. Multiple removable aperture members having different aperture sizes and shapes may be used to change the size and/or shape of the aperture by inserting or removing the aperture member having the desired size and/or shape. Alternately, a variable aperture member may be used.

While the foregoing is directed to certain embodiments, other and further embodiments may be devised without departing from the basic scope of this disclosure.

What is claimed is:

1. A method, sequentially comprising:
   disposing a semiconductor substrate on a support in a vacuum chamber;
   exposing the semiconductor substrate to a first pulsed laser radiation having a pulse duration between about 10 nsec and about 10 μsec;
   exposing the semiconductor substrate to a first semiconductor precursor;
   forming a molecular layer of the first semiconductor precursor on the semiconductor substrate;
   exposing the semiconductor substrate to a second semiconductor precursor;
   reacting the second semiconductor precursor with the molecular layer of the first semiconductor precursor to form an epitaxial semiconductor layer; and
   exposing the epitaxial semiconductor layer to a second pulsed laser radiation having the same pulse duration as the first pulsed laser radiation.

2. The method of claim 1, wherein the first pulsed laser radiation has a fluence between about 0.02 J/cm$^2$ and about 0.5 J/cm$^2$.

3. The method of claim 2, wherein the second pulsed laser radiation has a fluence substantially the same as the first pulsed laser radiation.

4. The method of claim 1, further comprising exposing the molecular layer of the first semiconductor precursor to a third pulsed laser radiation.

5. The method of claim 1, further comprising purging the first semiconductor precursor from the chamber before exposing the semiconductor substrate to the second semiconductor precursor.

6. The method of claim 1, wherein the exposing the semiconductor substrate to the first pulsed laser radiation and the exposing the semiconductor substrate to the second pulsed laser radiation are performed at a target zone of the substrate, wherein the target zone has an areal extent less than an areal extent of the substrate.

7. The method of claim 6, further comprising heating the substrate while exposing the substrate to the first and second semiconductor precursors.

8. The method of claim 7, further comprising identifying a subsequent target zone of the substrate, positioning the subsequent target zone to receive laser radiation from a laser source, and repeating the exposing the semiconductor substrate to a first pulsed laser radiation having a pulse duration between about 10 nsec and about 10 μsec, the exposing the semiconductor substrate to a first semiconductor precursor, the forming the molecular layer of the first semiconductor precursor on the irradiated semiconductor substrate, the exposing the semiconductor substrate to a second semiconductor precursor, the reacting the second semiconductor precursor with the molecular layer of the first semiconductor precursor to form an epitaxial semiconductor layer, and the exposing the epitaxial semiconductor layer to a second pulsed laser radiation having the same pulse duration as the first pulsed laser radiation.

9. A method, comprising:
   disposing a substrate on a substrate support in a processing chamber;
   identifying a first target zone of the substrate;
   positioning the first target zone of the substrate at a target location to receive a pulsed laser radiation field from a laser source by moving the substrate support or the laser source;
   exposing the target location to the pulsed laser radiation field;
   providing a first deposition precursor to the processing chamber;
   depositing a monolayer from the first deposition precursor on the target location to form an epitaxial layer from the first deposition precursor in the target location;
   exposing the epitaxial layer to the pulsed laser radiation field;
   providing a second deposition precursor to the processing chamber; and
   depositing a monolayer from the second deposition precursor on the epitaxial layer in the target location.

10. The method of claim 9, wherein the pulsed laser radiation field has a fluence between about 0.02 J/cm$^2$ and about 0.5 J/cm$^2$ and non-uniformity less than about 10%.

11. The method of claim 10, further comprising heating the substrate while exposing the target location and the epitaxial layer to the pulsed laser radiation field.

12. The method of claim 11, further comprising identifying a subsequent target zone adjacent to the first target zone, positioning the subsequent target zone at the target location, and repeating the exposing the target location to the pulsed laser radiation field, providing the first deposition precursor to the processing chamber, depositing the monolayer from the first deposition precursor on the target location to form an epitaxial layer from the first deposition precursor in the target location, exposing the epitaxial layer to the pulsed laser radiation field, providing the second deposition precursor to the processing chamber, and depositing the monolayer from the second deposition precursor on the epitaxial layer in the target location.

13. The method of claim 12, wherein the pulsed laser radiation field has a pulse duration between about 10 nsec and about 50 μsec.

14. The method of claim 13, wherein at least one instance of exposing the target location to the pulsed laser radiation field comprises delivering a plurality of laser pulses to the target location.

15. The method of claim 9, further comprising repeating the exposing the target location, providing the first deposition precursor, forming the epitaxial layer, exposing the epitaxial layer, providing the second deposition precursor, and depositing the monolayer until a target thickness is deposited.

16. A method, sequentially comprising:
   disposing a semiconductor substrate on a support in a vacuum chamber;
   exposing the semiconductor substrate to a first plurality of laser pulses, each pulse of the first plurality of laser pulses having a duration between about 10 nsec and about 10 μsec;
   exposing the semiconductor substrate to a first semiconductor precursor;
   forming a molecular layer of the first semiconductor precursor on the semiconductor substrate;

exposing the semiconductor substrate to a second semiconductor precursor;

reacting the second semiconductor precursor with the molecular layer of the first semiconductor precursor to form an epitaxial semiconductor layer; and exposing the epitaxial semiconductor layer to a second plurality of laser pulses, each pulse of the second plurality of laser pulses having a pulse duration between about 10 nsec and about 10 μsec.

17. The method of claim 16, wherein each pulse of the first plurality of laser pulses has a fluence between about 0.02 J/cm² and about 0.5 J/cm².

18. The method of claim 17, wherein each pulse of the second plurality of laser pulses has a fluence between about 0.02 J/cm² and about 0.5 J/cm².

19. The method of claim 16, further comprising exposing the molecular layer of the first semiconductor precursor to a third pulsed laser radiation.

20. The method of claim 16, further comprising purging the first semiconductor precursor from the chamber before exposing the semiconductor substrate to the second semiconductor precursor.

21. The method of claim 16, wherein the exposing the semiconductor substrate to the first plurality of laser pulses and the exposing the semiconductor substrate to the second plurality of laser pulses are performed at a target zone of the substrate, wherein the target zone has an areal extent less than an areal extent of the substrate.

22. The method of claim 21, further comprising heating the substrate while exposing the substrate to the first and second semiconductor precursors.

* * * * *